(12) United States Patent
Chistyakov

(10) Patent No.: US 6,896,773 B2
(45) Date of Patent: *May 24, 2005

(54) HIGH DEPOSITION RATE SPUTTERING

(75) Inventor: Roman Chistyakov, Andover, MA (US)

(73) Assignee: Zond, Inc., Mansfield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/065,739

(22) Filed: Nov. 14, 2002

(65) Prior Publication Data

US 2004/0094411 A1 May 20, 2004

(51) Int. Cl.[7] ............................................. C23C 14/35
(52) U.S. Cl. ........................... 204/192.12; 204/192.13; 204/298.03; 204/298.06; 204/298.07; 204/298.08; 204/298.14; 204/298.19
(58) Field of Search ........................ 204/192.12, 192.13, 204/298.03, 298.06, 298.07, 298.08, 298.14, 298.19

(56) References Cited

U.S. PATENT DOCUMENTS

| | | | |
|---|---|---|---|
| 4,588,490 A | 5/1986 | Cuomo et al. ............. | 204/298 |
| 5,015,493 A | 5/1991 | Gruen ....................... | 427/38 |
| 5,083,061 A | 1/1992 | Koshiishi et al. ......... | 315/111.81 |
| 5,286,360 A | 2/1994 | Szczyrbowski et al. ... | 204/298.08 |
| 5,718,813 A | 2/1998 | Drummond et al. ...... | 204/192.12 |
| 5,728,278 A | 3/1998 | Okamura et al. ......... | 204/298.11 |
| 5,733,418 A | 3/1998 | Hershcovitch et al. .. | 204/192.11 |
| 6,057,244 A | 5/2000 | Hausmann et al. ....... | 438/706 |
| 6,083,361 A | 7/2000 | Kobayashi et al. | |
| 6,238,537 B1 | 5/2001 | Kahn et al. ............... | 204/598.04 |
| 6,296,742 B1 | 10/2001 | Kouznetsov ............. | 204/192.12 |
| 6,361,667 B1 | 3/2002 | Kobayashi et al. ...... | 204/298.11 |
| 6,398,929 B1 * | 6/2002 | Chiang et al. ............ | 204/298.11 |
| 6,413,382 B1 | 7/2002 | Wang et al. .............. | 204/192.12 |
| 6,413,383 B1 | 7/2002 | Chiang et al. ............ | 204/192.13 |
| 6,436,251 B2 | 8/2002 | Gopalraja et al. ....... | 204/298.12 |
| 2002/0033480 A1 | 3/2002 | Kawamata et al. | |
| 2002/0114897 A1 | 8/2002 | Sumiya et al. ........... | 427/569 |

FOREIGN PATENT DOCUMENTS

| | | |
|---|---|---|
| DE | 3210351 A1 | 9/1983 |
| EP | 0 788 139 A1 | 8/1997 |
| GB | 1339910 | 12/1973 |
| JP | 57194254 | 11/1982 |
| WO | WO 98/40532 | 9/1998 |
| WO | WO 01/98553 A1 | 12/2001 |

OTHER PUBLICATIONS

US 5,863,392, 1/1999, Drummond et al. (withdrawn)
Turenko, et al., Magnetron Discharge In The Vapor Of The Cathode Material, Soviet Technical Physics Letters, Jul. 1989, pp. 519–520; vol. 15, No. 7, New York, US.

(Continued)

*Primary Examiner*—Rodney G. McDonald
(74) *Attorney, Agent, or Firm*—Kurt Rauschenbach; Rauschenback Patent Law Group, LLC

(57) ABSTRACT

Methods and apparatus for high-deposition sputtering are described. A sputtering source includes an anode and a cathode assembly that is positioned adjacent to the anode. The cathode assembly includes a sputtering target. An ionization source generates a weakly-ionized plasma proximate to the anode and the cathode assembly. A power supply produces an electric field between the anode and the cathode assembly that creates a strongly-ionized plasma from the weakly-ionized plasma. The strongly-ionized plasma includes a first plurality of ions that impact the sputtering target to generate sufficient thermal energy in the sputtering target to cause a sputtering yield of the sputtering target to be non-linearly related to a temperature of the sputtering target.

40 Claims, 13 Drawing Sheets

OTHER PUBLICATIONS

Booth, et al., The Transition From Symmetric To Asymmetric Discharges In Pulsed 13.56 MHz Capacity Coupled Plasmas, J. Appl. Phys., Jul. 15, 1997, pp. 552–560, vol. 82 (2), American Institute of Physics.

Bunshah, et al., Deposition Technologies For Films And Coatings, Materials Science Series, pp. 176–183, Noyes Publications, Park Ridge, New Jersey.

Daugherty, et al., Attachment–Dominated Electron–Beam–Ionized Discharges, Applied Science Letters, May 15, 1976, vol. 28, No. 10, American Institute of Physics.

Goto, et al., Dual Excitation Reactive Ion Etcher for Low Energy Plasma Processing, J. Vac. Sci. Technol. A, Sep./Oct. 1992, pp. 3048–3054, vol. 10, No. 5, American Vacuum Society.

Kouznetsov, et al., A Novel Pulsed Magnetron Sputter Technique Utilizing Very High Target Power Densities, Surface & Coatings Technology, pp. 290–293, Elsevier Sciences S.A.

Lindquist, et al., High Selectivity Plasma Etching Of Silicon Dioxide With A Dual Frequency 27/2 MHz Capacitive RF Discharge.

Macak, Reactive Sputter Deposition Process of Al2O3 and Characterization Of A Novel High Plasma Density Pulsed Magnetron Discharge, Linkoping Studies In Science And Technology, 1999, pp. 1–2, Sweden.

Macak, et al., Ionized Sputter Deposition Using An Extremely High Plasma Density Pulsed Magnetron Discharge, J. Vac. Sci. Technol. A., Jul./Aug. 2000, pp. 1533–1537, vol. 18, No. 4, American Vacuum Society.

Mozgrin, et al., High–Current Low–Pressure Quasi –Stationary Discharge In A Magnetic Field: Experimental Research, Plasma Physics Reports, 1995. pp. 400–409, vol. 21, No. 5, Mozgrin, Feitsov, Khodachenko.

Rossnagel, et al., Induced Drift Currents In Circular Planar Magnetrons, J. Vac. Sci. Technol. A., Jan./Feb. 1987, pp. 88–91, vol. 5, No. 1, American Vacuum Society.

Sheridan, et al., Electron Velocity Distribution Functions In A Sputtering Magnetron Discharge For The EXB Direction, J. Vac. Sci. Technol. A., Jul./Aug. 1998, pp. 2173–2176, Vol. 16, No. 4, American Vacuum Society.

Steinbruchel, A Simple Formula For Low–Energy Sputtering Yields, Applied Physics A., 1985, pp. 37–42, vol. 36, Springer–Verlag.

Chistyakov, Roman, High–Power Pulsed Magnetron Sputtering, U.S. Appl. No. 10/065,277, filed Sep. 30, 2002.

Chistyakov, Roman, High–Power Pulsed Magnetically Enhanced Plasma Processing, U.S. Appl. No. 10/065,551, filed Oct. 30, 2002.

Chistyakov, Roman, Methods and Apparatus for Generating High–Density Plasma, U.S. Appl. No. 10/065,629, filed Nov. 04, 2002.

Encyclopedia Of Low Temperature Plasma, p. 119, vol. 3.

Encyclopedia Of Low Temperature Plasma, p. 123, vol. 3.

* cited by examiner

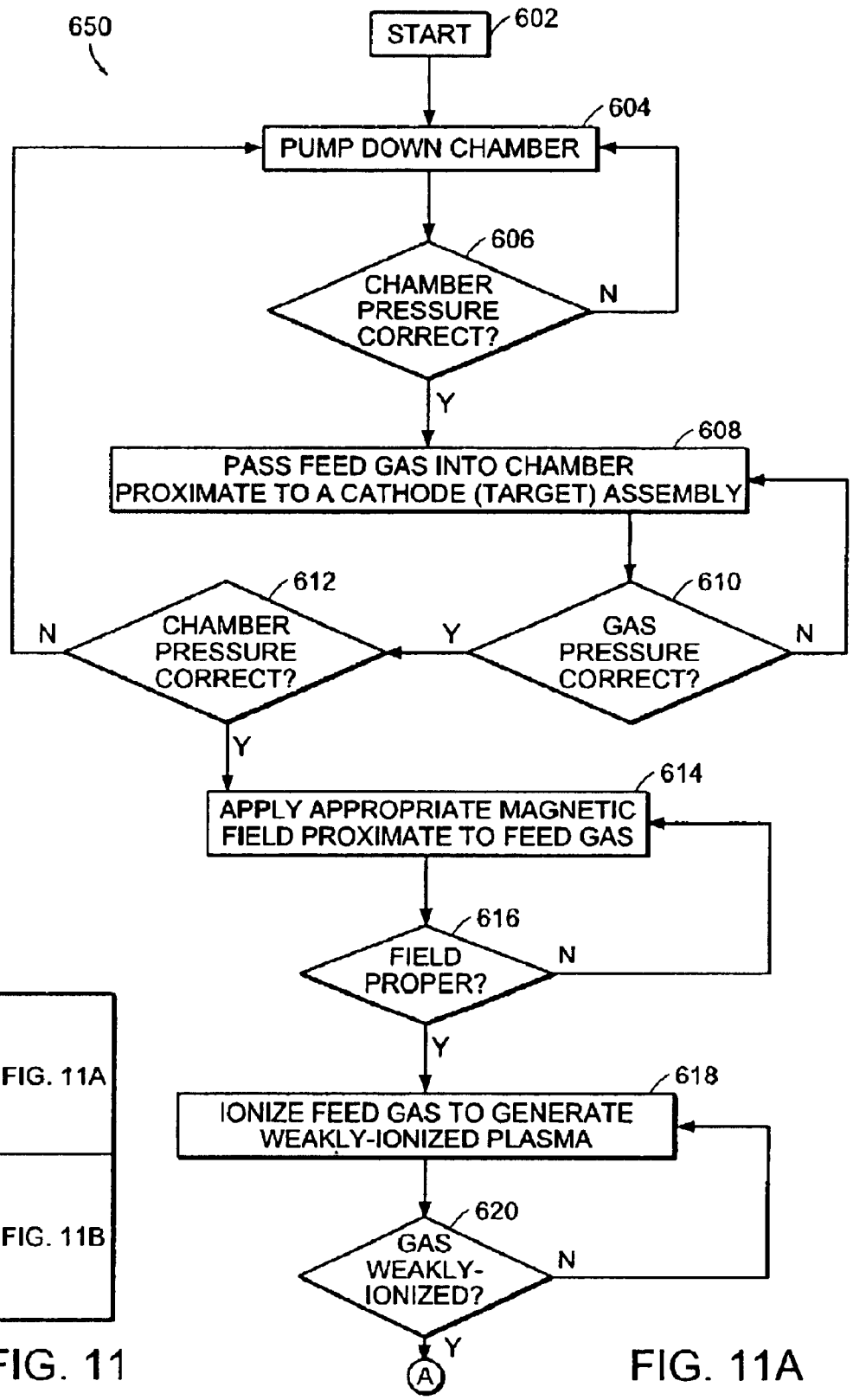

HIGH DEPOSITION RATE SPUTTERING

BACKGROUND OF INVENTION

Sputtering is a well-known technique for depositing films on substrates. Sputtering is the physical ejection of atoms from a target surface and is sometimes referred to as physical vapor deposition (PVD). Ions, such as argon ions, are generated and then directed to a target surface where the ions physically sputter target material atoms. The target material atoms ballistically flow to a substrate where they deposit as a film of target material.

Diode sputtering systems include a target and an anode. Sputtering is achieved in a diode sputtering system by establishing an electrical discharge in a gas between two parallel-plate electrodes inside a chamber. A potential of several kilovolts is typically applied between planar electrodes in an inert gas atmosphere (e.g., argon) at pressures that are between about $10^{-1}$ and $10^{-2}$ Torr. A plasma discharge is then formed. The plasma discharge is separated from each electrode by what is referred to as the dark space.

The plasma discharge has a relatively constant positive potential with respect to the target. Ions are drawn out of the plasma, and are accelerated across the cathode dark space. The target has a lower potential than the region in which the plasma is formed. Therefore, the target attracts positive ions. Positive ions move towards the target with a high velocity. Positive ions then impact the target and cause atoms to physically dislodge or sputter from the target. The sputtered atoms then propagate to a substrate where they deposit a film of sputtered target material. The plasma is replenished by electron-ion pairs formed by the collision of neutral molecules with secondary electrons generated at the target surface.

Magnetron sputtering systems use magnetic fields that are shaped to trap and to concentrate secondary electrons, which are produced by ion bombardment of the target surface. The plasma discharge generated by a magnetron sputtering system is located proximate to the surface of the target and has a high density of electrons. The high density of electrons causes ionization of the sputtering gas in a region that is close to the target surface.

One type of magnetron sputtering system is a planar magnetron sputtering system. Planar magnetron sputtering systems are similar in configuration to diode sputtering systems. However, the magnets (permanent or electromagnets) in planar magnetron sputtering systems are placed behind the cathode. The magnetic field lines generated by the magnets enter and leave the target cathode substantially normal to the cathode surface. Electrons are trapped in the electric and magnetic fields. The trapped electrons enhance the efficiency of the discharge and reduce the energy dissipated by electrons arriving at the substrate.

Conventional magnetron sputtering systems deposit films that have relatively low uniformity. The film uniformity can be increased by mechanically moving the substrate and/or the magnetron. However, such systems are relatively complex and expensive to implement. Conventional magnetron sputtering systems also have relatively poor target utilization. The term "target utilization" is defined herein to be a metric of how uniform the target material erodes during sputtering. For example, high target utilization would indicate that the target material erodes in a highly uniform manner.

In addition, conventional magnetron sputtering systems have a relatively low deposition rate. The term "deposition rate" is defined herein to mean the amount of material deposited on the substrate per unit of time. In general, the deposition rate is proportional to the sputtering yield. The term "sputtering yield" is defined herein to mean the number of target atoms ejected from the target per incident particle. Thus, increasing the sputtering yield will increase the deposition rate.

BRIEF DESCRIPTION OF DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

The sputtering process can be quantified in terms of the sputtering yield. The term "sputtering yield" is defined herein to mean the number of target atoms ejected from the target per incident particle. The sputtering yield depends on several factors, such as the target species, bombarding species, energy of the bombarding ions, and the angle of incidence of the bombarding ions. In typical known sputtering processes, the sputtering yield is generally insensitive to target temperature.

The deposition rate of a sputtering process is generally proportional to the sputtering yield. Thus, increasing the sputtering yield typically will increase the deposition rate. One way to increase the sputtering yield is to increase the ion density of the plasma so that a larger ion flux impacts the surface of the target. The density of the plasma is generally proportional to the number of ionizing collisions in the plasma.

Magnetic fields can be used to confine electrons in the plasma to increase the number of ionizing collisions between electrons and neutral atoms in the plasma. The magnetic and electric fields in magnetron sputtering systems are concentrated in narrow regions close to the surface of the target. These narrow regions are located between the poles of the magnets used for producing the magnetic field. Most of the ionization of the sputtering gas occurs in these localized regions. The location of the ionization regions causes non-uniform erosion or wear of the target that results in poor target utilization.

Increasing the power applied between the target and the anode can increase the production of ionized gas and, therefore, increase the target utilization and the sputtering yield. However, increasing the applied power can lead to undesirable target heating and target damage. Furthermore, increasing the voltage applied between the target and the anode increases the probability of establishing an undesirable electrical discharge (an electrical arc) in the process chamber. An undesirable electrical discharge can corrupt the sputtering process.

Pulsing the power applied to the plasma can be advantageous since the average discharge power can remain low while relatively large power pulses are periodically applied. Additionally, the duration of these large voltage pulses can be preset so as to reduce the probability of establishing an electrical breakdown condition leading to an undesirable electrical discharge. However, very large power pulses can still result in undesirable electrical discharges and undesirable target heating regardless of their duration.

Figure 1:
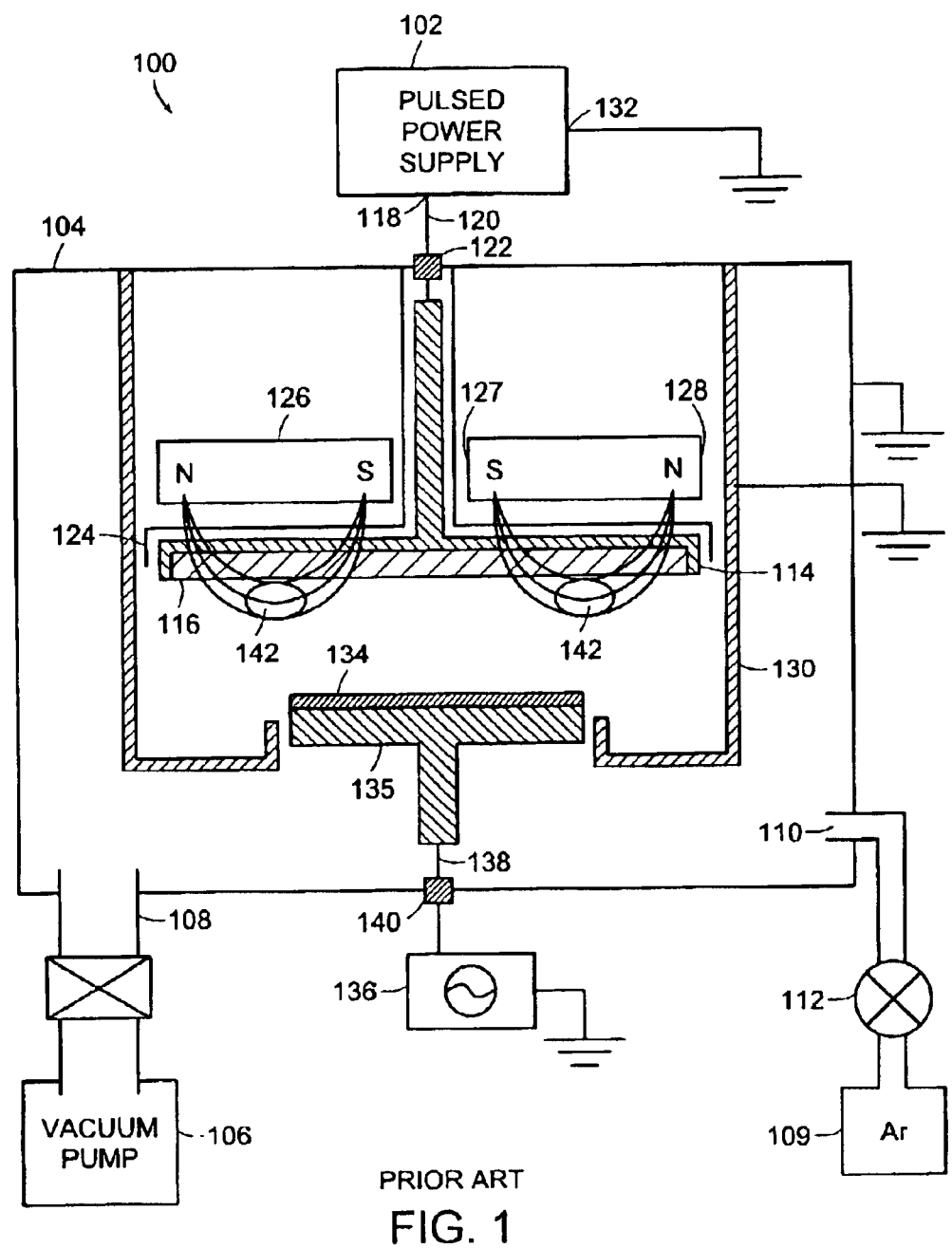
FIG. 1 illustrates a cross-sectional view of a known magnetron sputtering apparatus having a pulsed power source.

FIG. 1 illustrates a cross-sectional view of a known magnetron sputtering apparatus 100 having a pulsed power source 102. The known magnetron sputtering apparatus 100 includes a vacuum chamber 104 where the sputtering process is performed. The vacuum chamber 104 is positioned in fluid communication with a vacuum pump 106 via a conduit 108. The vacuum pump 106 is adapted to evacuate the vacuum chamber 104 to high vacuum. The pressure inside the vacuum chamber 104 is generally less than 100 Pa during operation. A feed gas source 109, such as an argon gas source, is coupled to the vacuum chamber 104 by a gas inlet 110. A valve 112 controls the gas flow from the feed gas source 109.

The magnetron sputtering apparatus 100 also includes a cathode assembly 114 having a target 116. The cathode assembly 114 is generally in the shape of a circular disk. The cathode assembly 114 is electrically connected to a first output 118 of the pulsed power supply 102 with an electrical transmission line 120. The cathode assembly 114 is typically coupled to the negative potential of the pulsed power supply 102. In order to isolate the cathode assembly 114 from the vacuum chamber 104, an insulator 122 can be used to pass the electrical transmission line 120 through a wall of the vacuum chamber 104. A grounded shield 124 can be positioned behind the cathode assembly 114 to protect a magnet 126 from bombarding ions. The magnet 126 shown in FIG. 1 is generally shaped in the form of a ring that has its south pole 127 on the inside of the ring and its north pole 128 on the outside of the ring. Many other magnet configurations can also be used.

An anode 130 is positioned in the vacuum chamber 104 proximate to the cathode assembly 114. The anode 130 is typically coupled to ground. A second output 132 of the pulsed power supply 102 is also typically coupled to ground. A substrate 134 is positioned in the vacuum chamber 104 on a substrate support 135 to receive the sputtered target material from the target 116. The substrate 134 can be electrically connected to a bias voltage power supply 136 with a transmission line 138. In order to isolate the bias voltage power supply 136 from the vacuum chamber 104, an insulator 140 can be used to pass the electrical transmission line 138 through a wall of the vacuum chamber 104.

In operation, the pulsed power supply 102 applies a voltage pulse between the cathode assembly 114 and the anode 130 that has a sufficient amplitude to ionize the argon feed gas in the vacuum chamber 104. The typical ionization process is referred to as direct ionization or atomic ionization by electron impact and can be described as follows:

where Ar represents a neutral argon atom in the feed gas and e⁻ represents an ionizing electron generated in response to the voltage pulse applied between the cathode assembly 114 and the anode 130. The collision between the neutral argon atom and the ionizing electron results in an argon ion (Ar⁺) and two electrons.

The negatively biased cathode assembly 114 attracts positively charged ions with sufficient acceleration so that the ions sputter the target material from the target 116. A portion of the sputtered target material is deposited on the substrate 134.

The electrons, which cause the ionization, are generally confined by the magnetic fields produced by the magnet 126. The magnetic confinement is strongest in a confinement region 142 where there is relatively low magnetic field intensity. The confinement region 142 is substantially in the shape of a ring that is located proximate to the target material. Generally, a higher concentration of positively charged ions in the plasma is present in the confinement region 142 than elsewhere in the chamber 104. Consequently, the target 116 is eroded more rapidly in areas directly adjacent to the higher concentration of positively charged ions. The rapid erosion in these areas results in undesirable non-uniform erosion of the target 116 and, thus relatively poor target utilization.

Dramatically increasing the power applied to the plasma can result in more uniform erosion of the target 116 and higher sputtering yield. However, the amount of applied power necessary to achieve this increased uniformity can increase the probability of generating an electrical breakdown condition that leads to an undesirable electrical discharge between the cathode assembly 114 and the anode 130 regardless of the duration of the pulses. An undesirable electrical discharge will corrupt the sputtering process and cause contamination in the vacuum chamber 104. Additionally, the increased power can overheat the target and cause target damage.

Sputtering yields are generally determined experimentally. The yield dependence on the bombarding ion energy approximately exhibits a threshold that is between about 10–30 eV, followed by a nearly linear range that extends to several hundred eV. At higher energies, the dependence is less than linear. Sputtering processes are generally most energy efficient when the ion energies are within the linear range.

Sputtering systems are generally calibrated to determine the deposition rate under certain operating conditions. The erosion rate of the target 116 can be expressed by the following equation:

$$R = k\frac{JYM}{\rho} \text{Å/min}$$

where k is a constant, J is the ion current density in mA/cm², Y is the sputtering yield in atoms/ion, and M is the atomic weight in grams, and ρ is the density in gm/cm³ of the target material. The deposition rate is generally proportional to the sputtering yield Y.

Figure 2:
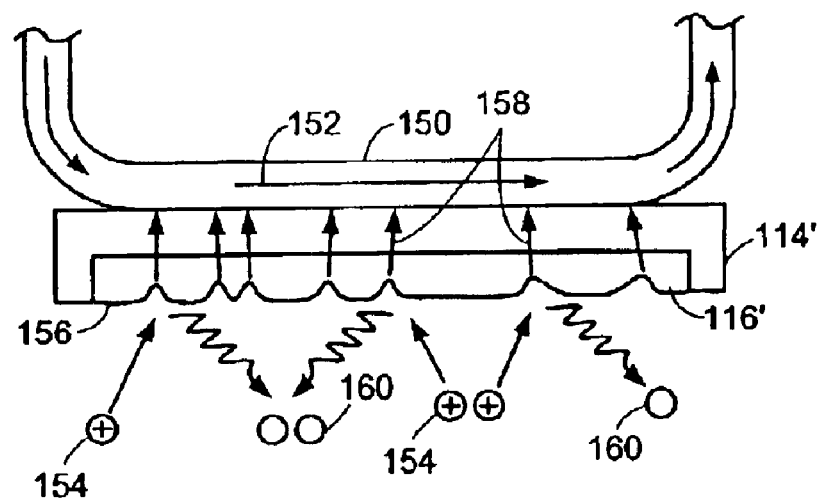
FIG. 2 illustrates a cross-sectional view of a prior art cathode assembly having a cathode cooling system.

FIG. 2 illustrates a cross-sectional view of a prior art cathode assembly 114' having a cathode cooling system. The cathode assembly 114' includes target 116'. The cathode cooling system also includes a conduit 150 that contains a fluid 152 for conducting heat away from the cathode assembly 114'. The fluid 152 can be a liquid coolant or a gas, for example.

In operation, ions 154 in a plasma impact a surface 156 of the target 116'. The impact of the ions 154 generates heat 158 at the surface 156. Additionally, the impact of the ions 154 eventually dislodges atoms 160 from the surface 156 of the target 116' causing sputtering. The heat 158 that is generated by the ion impact radiates through the cathode assembly 114'. The cathode assembly 114' is in thermal communication with the conduit 150. The fluid 152 absorbs the heat 158 and transfers it away from the cathode assembly 114'.

Figure 3:
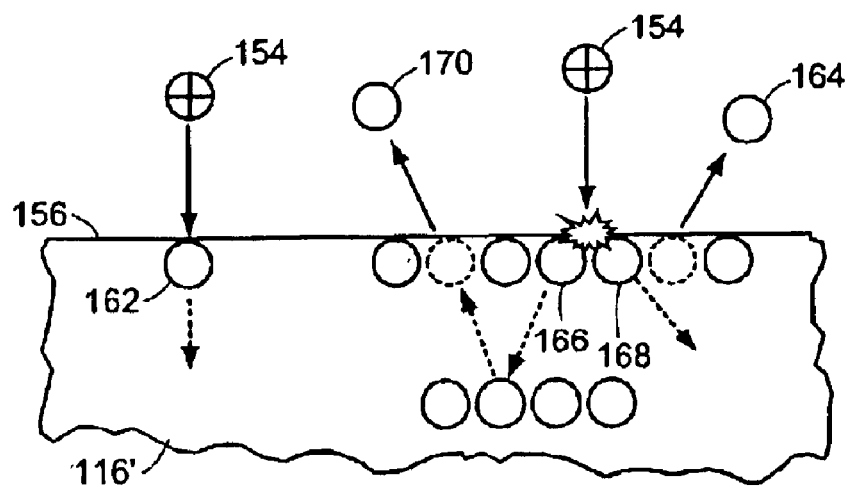
FIG. 3 illustrates a known process for sputtering material from a target.

FIG. 3 illustrates a known process for sputtering material from a target 116'. An ion 154 having a mass $M_i$ and a velocity $v_i$ impacts a target particle 162 having a mass $M_t$ which is initially at rest on the surface 156 of the target 116'. The ion 154 impacts the surface 156 at normal incidence. The momentum from the ion 154 transfers to the target particle 162 driving the target particle 162 into the target 116'.

Thus, the ejection of a sputtered particle 164 from the target 114' generally requires a sequence of collisions for a component of the initial momentum vector to change by more than ninety degrees. Typically, an incident ion 154 experiences a cascade of collisions and its energy is partitioned over a region of the target surface 156. However, the sputtering momentum exchange occurs primarily within a region extending only about ten angstroms below the surface 156. The incident ion 154 generally strikes two lattice atoms 166, 168 almost simultaneously. This low energy knock-on receives a side component of momentum and initiates sputtering of one or more of its neighbors. The primary knock-on is driven into the target 114', where it can be reflected and sometimes returned to the surface 156 to produce sputtering by impacting the rear of a surface atom 170.

A fraction of the kinetic energy of the incident ion 154 is transferred to the target particle 162. This kinetic energy transfer function can be expressed as follows:

$$\varepsilon = \frac{4 M_i M_t}{(M_i + M_t)^2}$$

The sputtering yield Y can be expressed as follows, assuming perpendicular ion incidence onto a substantially planar surface 156:

$$Y = k \times \varepsilon \times \frac{E}{U} \times \alpha(M_t / M_i)$$

where k is a constant, $\varepsilon$ is the energy transfer function, $\alpha$ is a near-linear function of the ratio of the mass of the target atom 162 to the mass of the incident ion 154, E is the kinetic energy of the incident ion 154, and U is the surface binding energy for the target material. For most sputtering materials, the mass dependence of $\varepsilon$ $\alpha$ does not vary greatly from one material to another. The primary material-sensitive factor is the surface binding energy, and this has only a first power dependence.

At energies above 20–30 eV, heavy particles can sputter atoms from a surface of a target. The sputtering yield increases rapidly with energy up to a few hundred eV, with 500–1000 eV argon ions being typically used for physical sputtering. Above a few hundred eV, there is a possibility that ions 154 will be implanted in the target 116'. This can especially occur at energies over 1 keV.

Figure 4:
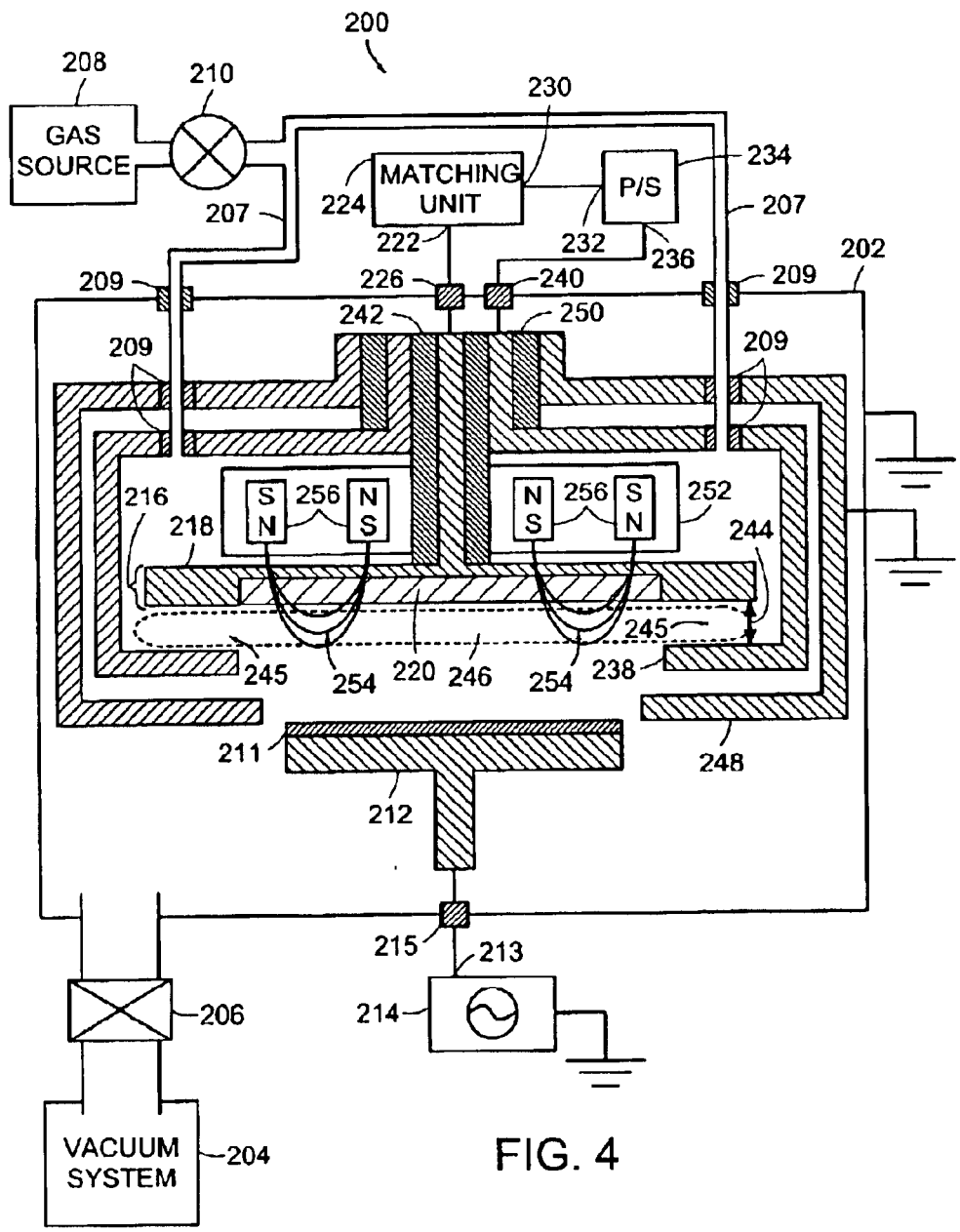
FIG. 4 illustrates a cross-sectional view of an embodiment of a magnetron sputtering apparatus according to the present invention.

FIG. 4 illustrates a cross-sectional view of an embodiment of a magnetron sputtering apparatus 200 according to the present invention. The magnetron sputtering apparatus 200 includes a chamber 202, such as a vacuum chamber. The chamber 202 is coupled in fluid communication to a vacuum system 204 through a vacuum valve 206. In one embodiment, the chamber 202 is electrically coupled to ground potential.

The chamber 202 is coupled to a feed gas source 208 by one or more gas lines 207. In one embodiment, the gas lines 207 are isolated from the chamber and other components by insulators 209. Additionally, the gas lines 207 can be isolated from the feed gas source using in-line insulating couplers (not shown). A gas flow control system 210 controls the gas flow to the chamber 202. The gas source 208 can contain any feed gas. For example, the feed gas can be a noble gas or a mixture of noble gases. The feed gas can also be a reactive gas, a non-reactive gas, or a mixture of both reactive and non-reactive gases.

A substrate 211 to be sputter coated is supported in the chamber 202 by a substrate support 212. The substrate 211 can be any type of work piece such as a semiconductor wafer. In one embodiment, the substrate support 212 is electrically coupled to an output 213 of a bias voltage source 214. An insulator 215 isolates the bias voltage source 214 from a wall of the chamber 202. In one embodiment, the bias voltage source 214 is an alternating current (AC) power source, such as a radio frequency (RF) power source. In other embodiments (not shown), the substrate support 212 is coupled to ground potential or is electrically floating.

The magnetron sputtering apparatus 200 also includes a cathode assembly 216. In one embodiment, the cathode assembly 216 includes a cathode 218 and a sputtering target 220 composed of target material. In one embodiment, the cathode 218 is formed of a metal. In one embodiment, the cathode 218 is formed of a chemically inert material, such as stainless steel. The sputtering target 220 is in physical contact with the cathode 218. In one embodiment, the sputtering target 220 is positioned inside the cathode 218 as shown in FIG. 4. The distance from the sputtering target 220 to the substrate 211 can vary from a few centimeters to about one hundred centimeters.

The target material can be any material suitable for sputtering. For example, the target material can be a metallic material, polymer material, superconductive material, magnetic material including ferromagnetic material, non-magnetic material, conductive material, non-conductive material, composite material, reactive material, or a refractory material.

The cathode assembly 216 is coupled to an output 222 of a matching unit 224. An insulator 226 isolates the cathode assembly 216 from a grounded wall of the chamber 202. An input 230 of the matching unit 224 is coupled to a first output 232 of a pulsed power supply 234. A second output 236 of the pulsed power supply 234 is coupled to an anode 238. An insulator 240 isolates the anode 238 from a grounded wall of the chamber 202. Another insulator 242 isolates the anode 238 from the cathode assembly 216.

In one embodiment (not shown), the first output 232 of the pulsed power supply 234 is directly coupled to the cathode assembly 216. In one embodiment (not shown), the second output 236 of the pulsed power supply 234 and the anode 238 are both coupled to ground. In one embodiment (not shown), the first output 232 of the pulsed power supply 234 couples a negative voltage impulse to the cathode assembly 216. In another embodiment (not shown), the second output 236 of the pulsed power supply 234 couples a positive voltage impulse to the anode 238.

In one embodiment, the pulsed power supply 234 generates peak voltage levels of between about 5 kV and about 30 kV. In one embodiment, operating voltages are generally between about 50V and 1 kV. In one embodiment, the pulsed power supply 234 sustains discharge current levels that are on order of about 1 A to 5,000 A depending on the volume of the plasma. Typical operating currents varying from less than about one hundred amperes to more than a few thousand amperes depending on the volume of the plasma. In one embodiment, the power pulses have a repetition rate that is below 1 kHz. In one embodiment, the pulse width of the pulses generated by the pulsed power supply 234 is substantially between about one microsecond and several seconds.

The anode 238 is positioned so as to form a gap 244 between the anode 238 and the cathode assembly 216 that is sufficient to allow current to flow through a region 245 between the anode 238 and the cathode assembly 216. In one embodiment, the gap 244 is between approximately 0.3 cm and 10 cm. The surface area of the cathode assembly 216 determines the volume of the region 245. The gap 244 and the total volume of the region 245 are parameters in the ionization process as described herein.

An anode shield 248 is positioned adjacent to the anode 238 and functions as an electric shield to electrically isolate the anode 238 from the plasma. In one embodiment, the anode shield 248 is coupled to ground potential. An insulator 250 is positioned to isolate the anode shield 248 from the anode 238.

The magnetron sputtering apparatus 200 also includes a magnet assembly 252. In one embodiment, the magnet assembly 252 is adapted to create a magnetic field 254 proximate to the cathode assembly 216. The magnet assembly 252 can include permanent magnets 256, or alternatively, electro-magnets (not shown). The configuration of the magnet assembly 252 can be varied depending on the desired shape and strength of the magnetic field 254. The magnet assembly can have either a balanced or unbalanced configuration.

In one embodiment, the magnet assembly 252 includes switching electro-magnets, which generate a pulsed magnetic field proximate to the cathode assembly 216. In some embodiments, additional magnet assemblies (not shown) can be placed at various locations around and throughout the chamber 202 to direct different types of sputtered target materials to the substrate 212.

In one embodiment, the magnetron sputtering apparatus 200 is operated by generating the magnetic field 254 proximate to the cathode assembly 216. In the embodiment shown in FIG. 2, the permanent magnets 256 continuously generate the magnetic field 254. In other embodiments, electro-magnets (not shown) generate the magnetic field 254 by energizing a current source that is coupled to the electro-magnets. In one embodiment, the strength of the magnetic field 254 is between about fifty gauss and two thousand gauss. After the magnetic field 254 is generated, the feed gas from the gas source 208 is supplied to the chamber 202 by the gas flow control system 210.

In one embodiment, the feed gas is supplied to the chamber 202 directly between the cathode assembly 216 and the anode 238. Directly injecting the feed gas between the cathode assembly 216 and the anode 238 can increase the flow rate of the gas between the cathode assembly 216 and the anode 238. Increasing the flow rate of the gas allows longer duration impulses and thus, can result in the formation higher density plasmas. The flow of the feed gas is further discussed herein.

In one embodiment, the pulsed power supply 234 is a component of an ionization source that generates the weakly-ionized plasma. The pulsed power supply applies a voltage pulse between the cathode assembly 216 and the anode 238. In one embodiment, the pulsed power supply 234 applies a negative voltage pulse to the cathode assembly 216. The amplitude and shape of the voltage pulse are such that a weakly-ionized plasma is generated in the region 246 between the anode 238 and the cathode assembly 216.

The weakly-ionized plasma is also referred to as a pre-ionized plasma. In one embodiment, the peak plasma density of the pre-ionized plasma is between about $10^6$ and $10^{12}$ cm$^{-3}$ for argon feed gas. In one embodiment, the pressure in the chamber varies from about $10^{-3}$ to 10 Torr. The peak plasma density of the pre-ionized plasma depends on the properties of the specific plasma processing system.

In one embodiment, the pulsed power supply 234 generates a low power pulse having an initial voltage that is between about 100V and 5 kV with a discharge current that is between about 0.1 A and 100 A in order to generate the weakly-ionized plasma. In some embodiments the width of the pulse can be on the order of 0.1 microseconds to one hundred seconds. Specific parameters of the pulse are discussed herein in more detail.

In one embodiment, the pulsed power supply 234 applies a voltage between the cathode assembly 216 and the anode 238 before the feed gas is supplied between the cathode assembly 216 and the anode 238. In another embodiment, the pulsed power supply 234 applies a voltage between the cathode assembly 216 and the anode 238 after the feed gas is supplied between the cathode assembly 216 and the anode 238.

In one embodiment, a direct current (DC) power supply (not shown) is used to generate and maintain the weakly-ionized or pre-ionized plasma. In this embodiment, the DC power supply is adapted to generate a voltage that is large enough to ignite the pre-ionized plasma. In one embodiment, the DC power supply generates an initial voltage of several kilovolts between the cathode assembly 216 and the anode 238 in order to generate and maintain the pre-ionized plasma. The initial voltage between the cathode assembly 216 and the anode 238 creates a plasma discharge voltage that is on the order of 100V to 1000V with a discharge current that is on the order of 0.1 A to 100 A.

The direct current required to generate and maintain the pre-ionized plasma is a function of the volume of the plasma. In addition, the current required to generate and maintain the pre-ionized plasma is a function of the strength of the magnetic field in the region 245. For example, in one embodiment, the DC power supply generates a current that is on order of 1 mA to 100 A depending on the volume of the plasma and the strength of the magnetic field in the region 245. The DC power supply can be adapted to generate and maintain an initial peak voltage between the cathode assembly 216 and the anode 238 before the introduction of the feed gas.

In another embodiment, an alternating current (AC) power supply (not shown) is used to generate and maintain the weakly-ionized or pre-ionized plasma. For example, the weakly-ionized or pre-ionized plasma can be generated and maintained using electron cyclotron resonance (ECR), capacitively coupled plasma discharge (CCP), or inductively coupled plasma (ICP) discharge. AC power supplies can require less power to generate and maintain a weakly-ionized plasma than a DC power supply. In addition, the pre-ionized or weakly-ionized plasma can be generated by numerous other techniques, such as UV radiation techniques, X-ray techniques, electron beam techniques, ion beam techniques, or ionizing filament techniques. In some embodiments, the weakly-ionized plasma is formed outside of the region 245 and then diffuses into the region 245.

Forming a weakly-ionized or pre-ionized plasma substantially eliminates the probability of establishing a breakdown condition in the chamber 202 when high-power pulses are applied between the cathode assembly 216 and the anode 238. Uniformly distributing the weakly-ionized or pre-ionized plasma over the cathode area results in a more uniform strongly ionized plasma when a high power pulse is applied. The probability of establishing a breakdown condition is substantially eliminated because the weakly-ionized plasma has a low-level of ionization that provides electrical conductivity through the plasma. This conductivity greatly reduces or prevents the possibility of a breakdown condition when high power is applied to the plasma.

Once the weakly-ionized plasma is formed, high-power pulses are then generated between the cathode assembly 216 and the anode 238. In one embodiment, the pulsed power supply 234 generates the high-power pulses. The desired power level of the high-power pulse depends on several factors including the desired deposition rate, the density of the pre-ionized plasma, and the volume of the plasma, for example. In one embodiment, the power level of the high-power pulse is in the range of about 1 kW to about 10 MW. In one embodiment, the high-power pulses are rapidly applied across the weakly-ionized plasma. In one embodiment, the high-power pulses are substantially instantly applied across the weakly-ionized plasma in a substantially explosive manner. This rapid application of the high-power pulses can result in a surface layer of the target 220 being almost instantly evaporated.

Each of the high-power pulses are maintained for a predetermined time that, in one embodiment, is in the range of about one microsecond to about ten seconds. In one embodiment, the repetition frequency or repetition rate of the high-power pulses is in the range of between about 0.1 Hz to 1 kHz. In order to minimize undesirable substrate heating, the average power generated by the pulsed power supply 234 can be less than one megawatt depending on the volume of the plasma.

In one embodiment, the high-power pulse is applied so rapidly that a surface layer of the target 220 is substantially vaporized and only a small quantity of heat is conducted through the cathode assembly 216. In one embodiment, the thermal energy in at least one of the cathode assembly 216, the anode 238, and the substrate support 212 is conducted away or dissipated by liquid or gas cooling such as helium cooling (not shown).

The high-power pulses generate a strong electric field between the cathode assembly 216 and the anode 238. This strong electric field is substantially located in the region 245 across the gap 244 between the cathode assembly 216 and the anode 238. In one embodiment, the electric field is a pulsed electric field. In another embodiment, the electric field is a quasi-static electric field. The term "quasi-static electric field" is defined herein to mean an electric field that has a characteristic time of electric field variation that is much greater than the collision time for electrons with neutral gas particles. Such a time of electric field variation can be on the order of ten seconds. The strength and the position of the strong electric field will be discussed in more detail herein.

The high-power pulses generate a highly-ionized or a strongly-ionized plasma from the weakly-ionized plasma. For example, the discharge current that is formed from this strongly-ionized plasma can be on the order of 5 kA for a pressure that is on the order of about 100 mTorr and 10 Torr.

Since the sputtering target 220 is typically negatively biased, the positively charged ions in the strongly-ionized plasma accelerate at high velocity towards the sputtering target 220. The accelerated ions impact the surface of the sputtering target 220, causing the target material to be sputtered. The strongly-ionized plasma of the present invention results in a very high sputtering rate of the target material.

In addition, the strongly-ionized plasma tends to diffuse homogenously in the region 246 and, therefore tends to create a more homogeneous plasma volume. The homogenous diffusion results in accelerated ions impacting the surface of the sputtering target 220 in a more uniform manner than with conventional magnetron sputtering. Consequently, the surface of the sputtering target 220 is eroded more evenly and, thus higher target utilization is achieved. Furthermore, since the target material is sputtered more uniformly across the surface of the sputtering target 220, the uniformity and homogeneity of the material deposited on the substrate 211 is also increased without the necessity of rotating the substrate 211 and/or the magnet assembly 252.

In one embodiment, the high-power pulsed magnetron sputtering system 200 of the present invention generates a relatively high electron temperature plasma and a relatively high density plasma. One application for the high-power pulsed magnetron sputtering system 200 of the present invention is ionized physical vapor deposition (IPVD), which is a technique that converts neutral sputtered atoms into positive ions in order to enhance the sputtering process.

Figure 5A:
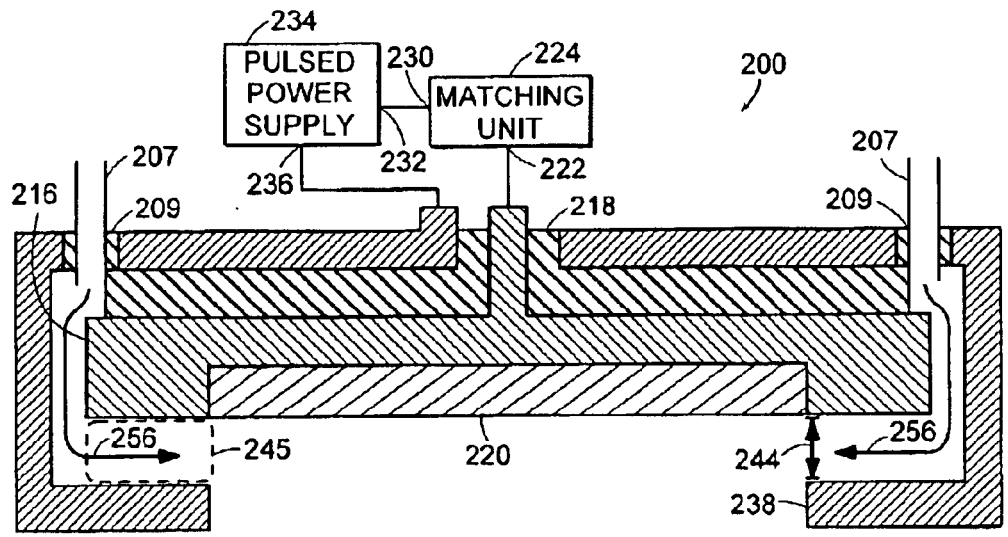
FIG. 5A through FIG. 5D illustrate cross-sectional views of the magnetron sputtering apparatus of FIG. 4.

FIG. 5A through FIG. 5D illustrate cross-sectional views of the sputtering apparatus 200 having the pulsed power supply 234. For example, FIG. 5A illustrates a cross-sectional view of the sputtering apparatus 200 having the pulsed power supply 234 at a time before the pulsed power supply 234 is activated. FIG. 5A illustrates the cathode assembly 216 including the sputtering target 220. The cathode assembly 216 is coupled to the output 222 of the matching unit 224. The input 230 of the matching unit 224 is coupled to the first output 232 of the pulsed power supply 234. The second output 236 of the pulsed power supply 234 is coupled to the anode 238.

The anode 238 is positioned so as to form a gap 244 between the anode 238 and the cathode assembly 216 that is sufficient to allow current to flow through the region 245 between the anode 238 and the cathode assembly 216. In one embodiment, the width of the gap 244 is between approximately 0.3 cm and 10 cm. The surface area of the cathode assembly 216 determines the volume of the region 245. The gap 244 and the total volume of the region 245 are parameters in the ionization process as described herein. The gas lines 207 provide feed gas 256 from the feed gas source 208 (FIG. 4) proximate to the anode 238 and the cathode assembly 216.

In operation, the feed gas 256 from the gas source 208 is supplied by the gas flow control system 210 (FIG. 4). Preferably, the feed gas 256 is supplied between the cathode assembly 216 and the anode 238. Directly injecting the feed gas 256 between the cathode assembly 216 and the anode 238 can increase the flow rate of the feed gas 256. This causes a rapid volume exchange in the region 245 between the cathode assembly 216 and the anode 238, which permits a high power pulse having a longer duration to be applied across the gap 244. The longer duration high power pulse results in the formation of more dense plasma. This volume exchange is described herein in more detail.

Figure 5B:
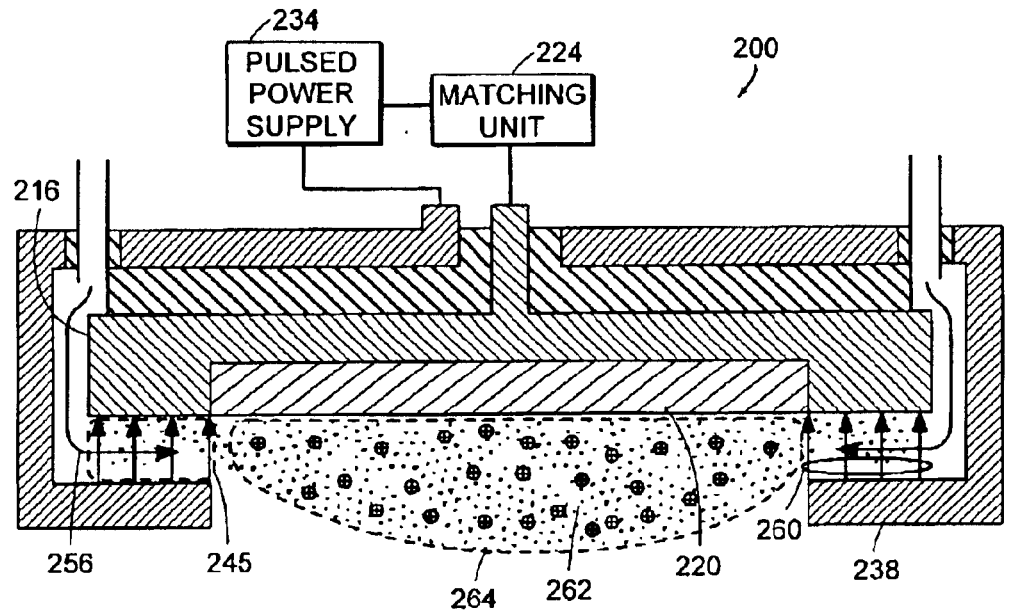
Figure 5C:
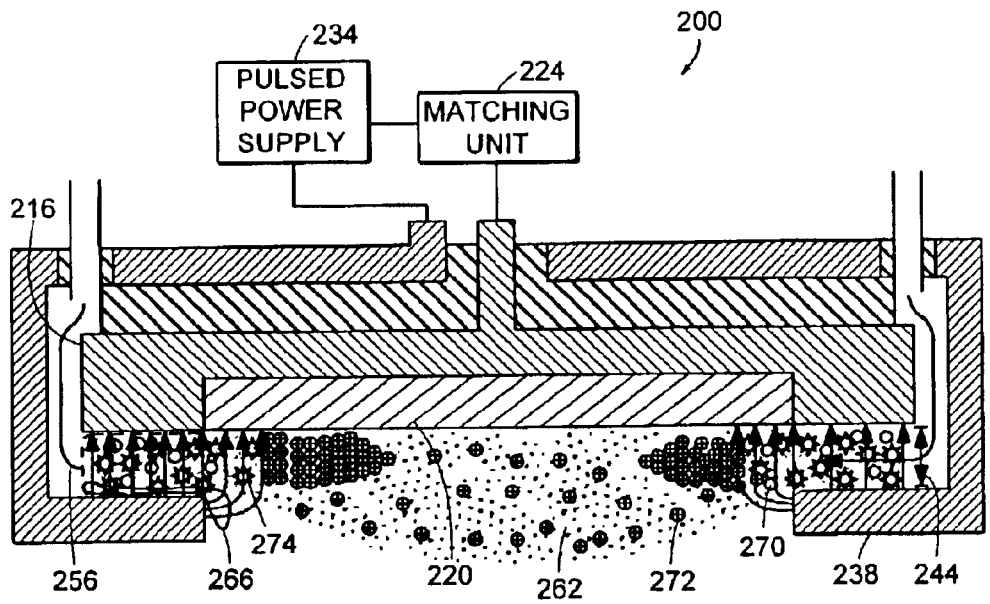

FIG. 5B illustrates the cathode assembly 216 after the feed gas 256 is supplied between the cathode assembly 216 and the anode 238. The pulsed power supply 234 applies a voltage pulse between the cathode assembly 216 and the anode 238. In one embodiment, the pulsed power supply 234 applies a negative voltage pulse to the cathode assembly 216. The characteristics of the voltage pulse are chosen such that an electric field 260 develops between the cathode assembly 216 and the anode 238 that creates a weakly-ionized plasma 262 in the region 245 between the anode 238 and the cathode assembly 216. The weakly-ionized plasma 262 is also referred to as a pre-ionized plasma.

In one embodiment, the pulsed power supply 234 generates the weakly-ionized plasma 262 by generating a low power pulse having an initial voltage that is in the range of 100V to 5 kV with a discharge current that is in the range of 0.1 A to 100 A. In some embodiments, the width of the pulse can be in the range of 0.1 microseconds to one hundred seconds. Specific parameters of the pulse are discussed herein in more detail.

In another embodiment, an alternating current (AC) power supply (not shown) is used to generate and maintain the weakly-ionized or pre-ionized plasma 262. The weakly-ionized or pre-ionized plasma 262 can be generated and maintained using electron cyclotron resonance (ECR), capacitively coupled plasma discharge (CCP), or inductively coupled plasma (ICP) discharge. Generating the pre-ionized plasma using an AC power supply can be more energy efficient than generating the pre-ionized plasma using a DC power supply.

In addition, the pre-ionized or weakly-ionized plasma 262 can be generated by numerous other techniques, such as UV radiation techniques, X-ray techniques, electron beam techniques, ion beam techniques, or ionizing filament techniques. These techniques include components used in ionization sources according to the invention. In some embodiments, the weakly-ionized plasma is formed outside of the region 245 and then diffuses into the region 245.

In one embodiment, as the feed gas 256 is pushed through the region 245, the weakly-ionized plasma 262 diffuses generally in a homogeneous manner through the region 264. The homogeneous diffusion tends to facilitate the creation of a highly uniform strongly-ionized plasma in the region 264. In one embodiment (not shown), the weakly-ionized plasma 262 is trapped proximate to the cathode assembly 216 by a magnetic field. Specifically, electrons in the weakly-ionized plasma 262 are trapped by a magnetic field generated proximate to the cathode assembly 216. In one embodiment, the strength of the magnetic field is in the range of fifty to two thousand gauss.

The pulsed power supply 234 generates high-power pulses between the cathode assembly 216 and the anode 238 (FIG. 5C) after the weakly-ionized plasma 262 is formed. The desired power level of the high-power pulses depends on several factors including the density of the weakly-ionized plasma 262 and the volume of the plasma. In one embodiment, the power level of the high-power pulse is in the range of about 1 kW to about 10 MW or higher.

The high-power pulses generate a strong electric field 266 between the cathode assembly 216 and the anode 238. The strong electric field 266 is substantially located in the region 245 between the cathode assembly 216 and the anode 238. In one embodiment, the electric field 266 is a pulsed electric field. In another embodiment, the electric field 266 is a quasi-static electric field. The strength and the position of the strong electric field 266 will be discussed in more detail herein.

Figure 5D:
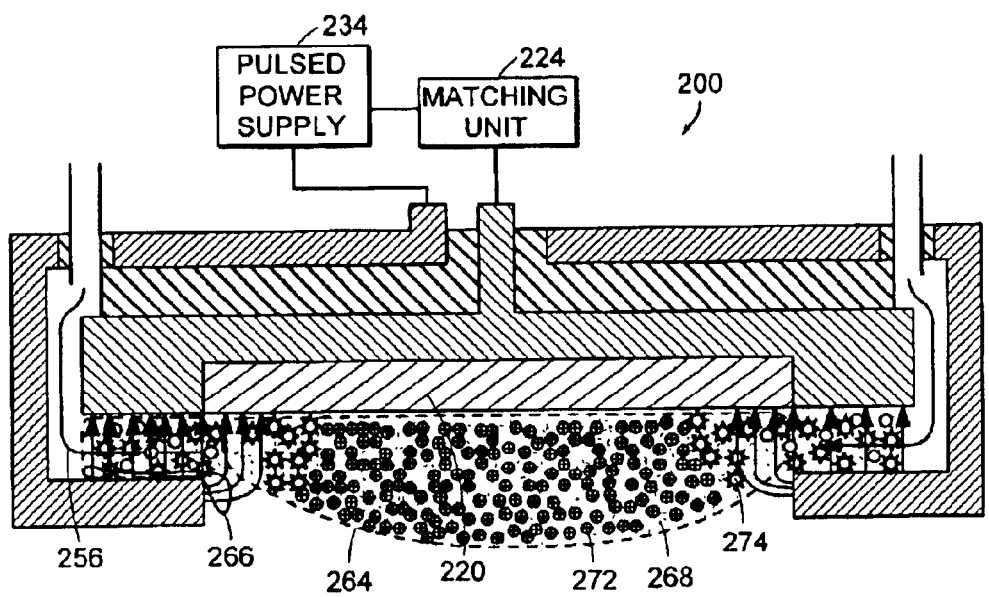

FIG. 5D illustrates the high-power pulses generating a highly-ionized or a strongly-ionized plasma 268 from the weakly-ionized plasma 262. The strongly-ionized plasma 268 is also referred to as a high-density plasma. The discharge current that is formed from the strongly-ionized plasma 268 can be on the order of about 1,000 A or more with a discharge voltage in the range of 50V to 1,000V for a pressure that is in the range of 5 mTorr and 10 Torr. In one embodiment, the strongly-ionized plasma 268 tends to diffuse homogenously in the region 264. The homogeneous diffusion creates a more homogeneous plasma volume.

The homogenous diffusion results in accelerated ions 272 in the strongly-ionized plasma 268 impacting the surface of the sputtering target 220 in a more uniform manner than with conventional magnetron sputtering. Consequently, the surface of the sputtering target 220 is eroded more evenly and, thus higher target utilization is achieved. Furthermore, since the target material is sputtered more uniformly across the surface of the sputtering target 220, the target material is deposited more uniformly on the substrate 211 (FIG. 4) without the necessity of rotating the substrate and/or the magnetron.

The strong electric field 266 facilitates a multi-step ionization process of the feed gas 256 that substantially increases the rate at which the strongly-ionized plasma 268 is formed. Referring again to FIG. 2D, the multi-step or stepwise ionization process is described as follows. A pre-ionizing voltage is applied between the cathode assembly 216 and the anode 238 across the feed gas 256, which forms the weakly-ionized plasma 262. The weakly-ionized plasma 262 is generally formed in the region 245 and diffuses to the region 264 as the feed gas 256 continues to flow.

In one embodiment, a magnetic field 254 (FIG. 4) is generated in the region 245 and extends to the center of the cathode assembly 216. This magnetic field tends to assist in diffusing electrons from the region 245 to the region 264. The electrons in the weakly-ionized plasma 262 are substantially trapped in the region 264 by the magnetic field 245. In one embodiment, the volume of weakly-ionized plasma 262 in the region 245 is rapidly exchanged with a fresh volume of feed gas 256.

The pulsed power supply 234 applies a high-power pulse between the cathode assembly 216 and the anode 238 after the formation of the weakly-ionized plasma 262 (FIG. 2C). This high-power pulse generates the strong electric field 266 in the region 245 between the cathode assembly 216 and the anode 238. The strong electric field 266 results in collisions occurring between neutral atoms 270, electrons (not shown), and ions 272 in the weakly-ionized plasma 262. These collisions generate numerous excited atoms 274 in the weakly-ionized plasma 262.

The accumulation of excited atoms 274 in the weakly-ionized plasma 262 alters the ionization process. In one embodiment, the strong electric field 266 facilitates a multi-step ionization process of an atomic feed gas that significantly increases the rate at which the strongly-ionized plasma 268 is formed. The multi-step ionization process has an efficiency that increases as the density of excited atoms 274 in the weakly-ionized plasma 262 increases. In one embodiment the strong electric field 266 enhances the formation of ions of a molecular or atomic feed gas.

In one embodiment, the distance or gap 244 between the cathode assembly 216 and the anode 238 is chosen so as to maximize the rate of excitation of the atoms. The value of the electric field 266 in the region 245 depends on the voltage level applied by the pulsed power supply 234 and the dimensions of the gap 244 between the anode 238 and the cathode assembly 216. In some embodiments, the strength of the electric field 266 is in range of 10V/cm to $10^5$ V/cm depending on various system parameters and operating conditions of the plasma system.

In some embodiments, the gap 244 is in the range of 0.30 cm to 10 cm depending on various parameters of the desired plasma. In one embodiment, the electric field 266 in the region 245 is rapidly applied to the pre-ionized or weakly-ionized plasma 262. In some embodiments, the rapidly applied electric field 266 is generated by applying a voltage pulse having a rise time that is in the range of 0.1 microsecond to ten seconds.

In one embodiment, the dimensions of the gap 244 and the parameters of the applied electric field 266 are varied to determine the optimum condition for a relatively high rate of excitation of the atoms 270 in the region 245. For example, an argon atom requires an energy of about 11.55 eV to become excited. Thus, as the feed gas 256 flows through the region 245, the weakly-ionized plasma 262 is formed and the atoms 270 in the weakly-ionized plasma 262 experience a stepwise ionization process.

The excited atoms 274 in the weakly-ionized plasma 262 then encounter the electrons (not shown) that are in the region 264. The excited atoms 274 only require about 4 eV of energy to ionize while neutral atoms 270 require about 15.76 eV of energy to ionize. Therefore, the excited atoms 274 will ionize at a much higher rate than the neutral atoms 270. In one embodiment, ions 272 in the strongly-ionized plasma 268 strike the cathode assembly 216 causing secondary electron emission. These secondary electrons interact with neutral 270 or excited atoms 274 in the strongly-ionized plasma 268. This process further increases the density of ions 272 in the strongly-ionized plasma 268 as the feed gas 256 is replenished.

The multi-step ionization process corresponding to the rapid application of the electric field 266 can be described as follows:

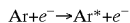

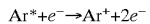

where Ar represents a neutral argon atom 270 in the feed gas 256 and e⁻ represents an ionizing electron generated in response to a pre-ionized plasma 262, when sufficient voltage is applied between the cathode assembly 216 and the anode 238. Additionally, Ar* represents an excited argon atom 274 in the weakly-ionized plasma 262. The collision between the excited argon atom 274 and the ionizing electron results in an argon ion (Ar⁺) and two electrons.

The excited argon atoms 274 generally require less energy to become ionized than neutral argon atoms 270. Thus, the excited atoms 274 tend to more rapidly ionize near the surface of the cathode assembly 216 than the neutral argon atoms 270. As the density of the excited atoms 274 in the plasma increases, the efficiency of the ionization process rapidly increases. This increased efficiency eventually results in an avalanche-like increase in the density of the strongly-ionized plasma 268. Under appropriate excitation conditions, the proportion of the energy applied to the weakly-ionized plasma 262 that is transformed to the excited atoms 274 is very high for a pulsed discharge in the feed gas 256.

Thus, in one aspect of the invention, high power pulses are applied to a weakly-ionized plasma 262 across the gap 244 to generate the strong electric field 266 between the anode 238 and the cathode assembly 216. This strong electric field 266 generates excited atoms 274 in the weakly-ionized plasma 262. The excited atoms 274 are rapidly ionized by secondary electrons emitted by the cathode assembly 216. This rapid ionization results in a strongly-ionized plasma 268 having a large ion density being formed in the area 264 proximate to the cathode assembly 216. The strongly-ionized plasma 268 is also referred to as a high-density plasma.

In one embodiment of the invention, a higher density plasma is generated by controlling the flow of the feed gas 256 in the region 245. In this embodiment, a first volume of feed gas 256 is supplied to the region 245. The first volume of feed gas 256 is then ionized to form a weakly-ionized plasma 262 in the region 245. Next, the pulsed power supply 234 applies a high power electrical pulse across the weakly-ionized plasma 262. The high power electrical pulse generates a strongly-ionized plasma 268 from the weakly-ionized plasma 262.

The level and duration of the high power electrical pulse is limited by the level and duration of the power that the strongly-ionized plasma 268 can absorb before the high power discharge contracts and terminates. In one embodiment, the strength and the duration of the high-power electrical pulse are increased and thus the density of the strongly-ionized plasma 268 is increased by increasing the flow rate of the feed gas 256.

In one embodiment, the strongly-ionized plasma 268 is transported through the region 245 by a rapid volume exchange of feed gas 256. As the feed gas 256 moves through the region 245, it interacts with the moving strongly-ionized plasma 268 and also becomes strongly-ionized from the applied high-power electrical pulse. The ionization process can be a combination of direct ionization and/or stepwise ionization as described herein. Transporting the strongly-ionized plasma 268 through the region 245 by a rapid volume exchange of the feed gas 256 increases the level and the duration of the power that can be applied to the strongly-ionized plasma 268 and, thus, generates a higher density strongly-ionized plasma in the region 264.

As previously discussed, to increase the efficiency of the ionization process, a magnetic field (not shown) can be generated proximate to the cathode assembly 216. The magnetic field substantially traps electrons in the weakly-ionized plasma 262 and secondary electrons from the cathode assembly 216 proximate to the cathode assembly 216. The trapped electrons ionize the excited atoms 274 generating the strongly-ionized plasma 268. In one embodiment, the magnetic field is generated in the region 245 to substantially trap electrons in the area where the weakly-ionized plasma 262 is ignited.

In one embodiment, a strongly-ionized plasma 268 according to the present invention is used to sputter magnetic materials. Conventional magnetron sputtering generally is not suitable for sputtering magnetic materials, since the magnetic field generated by the magnetron can be absorbed by the magnetic target. Traditional RF diode sputtering can be used to sputter magnetic materials. However, this method generally results in very poor uniformity of the sputtered film, relatively low plasma density, and relatively low deposition rate.

According to the present invention, magnetic materials can be sputtering by driving a target assembly including a magnetic target material with a RF power supply (not shown). For example, the RF power supply can provide a power of up to about 10 kW. A substantially uniform weakly-ionized plasma can be generated by applying RF power across a feed gas that is located proximate to the target assembly. The strongly-ionized plasma is generated by applying a strong electric field across the weakly-ionized plasma as described herein. Since the RF power supply applies a negative voltage bias to the target assembly, ions in the strongly-ionized plasma bombard the target material causing sputtering.

In one embodiment, a strongly-ionized plasma 268 according to the present invention is used to sputter dielectric materials. Dielectric materials are sputtered according to the present invention by driving a target assembly including a dielectric target material with a RF power supply (not shown). For example, the RF power supply can provide a power of up to about 10 kW. A substantially uniform weakly-ionized plasma can be generated by applying RF power across a feed gas that is located proximate to the target assembly.

In one embodiment, a magnetic field can be generated proximate to the target assembly in order to trap electrons in the weakly-ionized plasma. The strongly-ionized plasma is generated by applying a strong electric field across the weakly-ionized plasma as described herein. Since the RF power supply applies a negative voltage bias to the target assembly, ions in the strongly-ionized plasma bombard the target material causing sputtering.

In one embodiment, a DC power supply (not shown) is used to create a weakly-ionized plasma 232 for sputtering a dielectric target material according to the present invention. In this embodiment, the dielectric target material is positioned relative to the cathode 218 such that an area of the cathode 218 can conduct a direct current between the anode 238 and the cathode 218.

Figure 6:
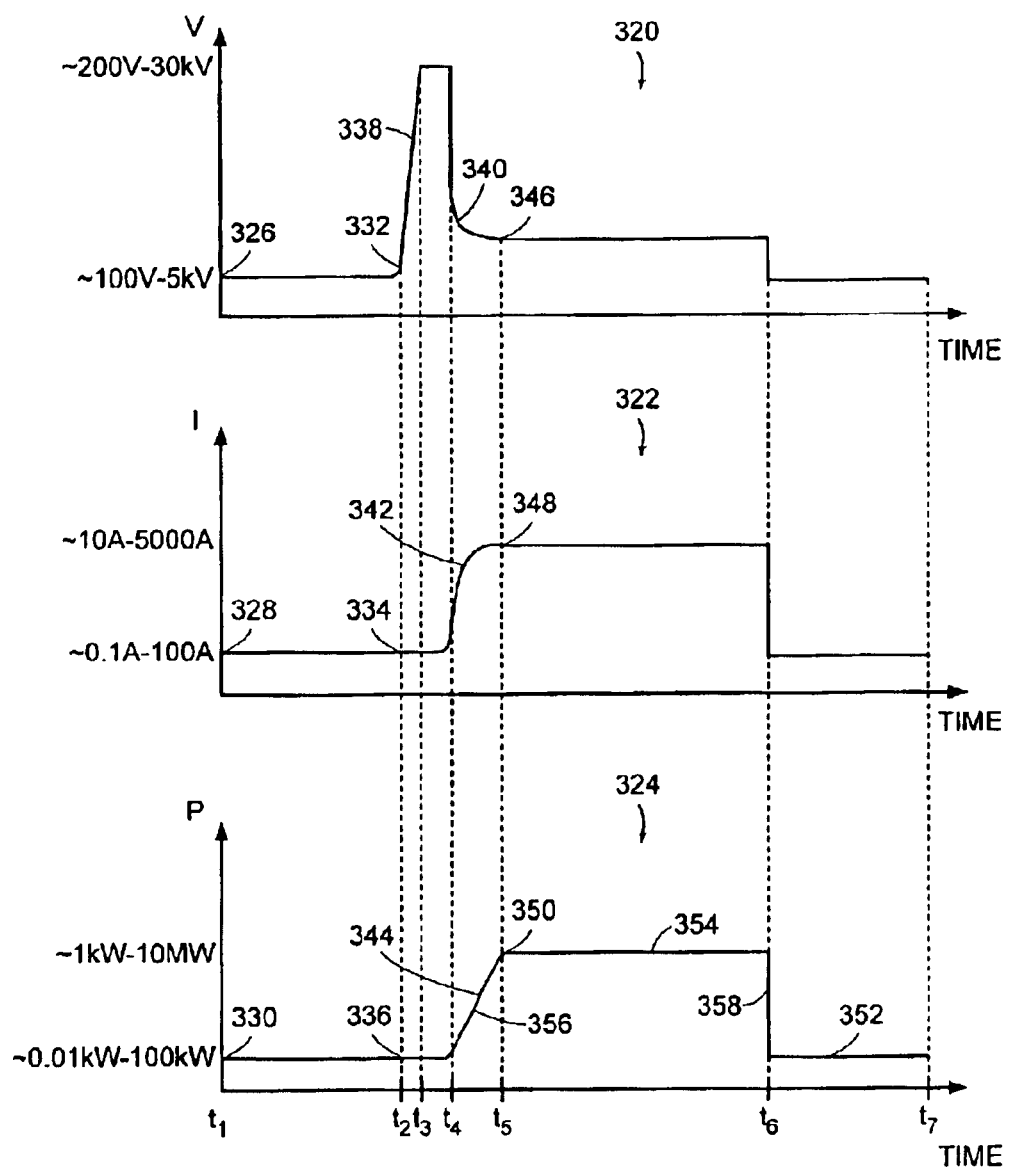
FIG. 6 illustrates graphical representations of the applied voltage, current, and power as a function of time for periodic pulses applied to the plasma in the magnetron sputtering apparatus of FIG. 4.

FIG. 6 illustrates graphical representations 320, 322, and 324 of the absolute value of applied voltage, current, and power, respectively, as a function of time for periodic pulses applied to the plasma in the sputtering apparatus 200 of FIG. 4. In one embodiment, at time t₀ (not shown), the feed gas 256 flows proximate to the cathode assembly 216 before the pulsed power supply 234 is activated. The time required for a sufficient quantity of feed gas 256 to flow proximate to the cathode assembly 216 depends on several factors including the flow rate of the feed gas 256 and the desired pressure in the region 245.

In the embodiment shown in FIG. 6, the power supply 234 generates a constant power. At time $t_1$, the pulsed power supply 234 generates a voltage 326 across the anode 238 and the cathode assembly 216. In one embodiment, the voltage 326 is approximately between 100V and 5 kV. The period between time $t_0$ and time $t_1$ (not shown) can be on the order of several microseconds up to several milliseconds. At time $t_1$, the current 328 and the power 330 have constant values.

Between time $t_1$ and time $t_2$, the voltage 326, the current 328, and the power 330 remain constant as the weakly-ionized plasma 262 (FIG. 5B) is generated. The voltage 332 at time $t_2$ is in the range of 100V to 5 kV. The current 334 at time $t_2$ is in the range of 0.1 A to 100 A. The power 336 delivered at time $t_2$ is in the range of 0.01 kW to 100 kW.

The power 336 generated by the pulsed power supply 234 partially ionizes the gas 256 that is located in the region 245 between the cathode assembly 216 and the anode 238. The partially ionized gas is also referred to as a weakly-ionized plasma or a pre-ionized plasma 262. As described herein, the formation of the weakly-ionized plasma 262 substantially eliminates the possibility of creating a breakdown condition when high-power pulses are applied to the weakly-ionized plasma 262. The suppression of this breakdown condition substantially eliminates the occurrence of undesirable arcing between the anode 238 and the cathode assembly 216.

In one embodiment, the period between time $t_1$ and time $t_2$ is in the range of one microsecond to one hundred seconds to allow the pre-ionized plasma 262 to form and be maintained at a sufficient plasma density. In one embodiment, the power 336 from the pulsed power supply 234 is continuously applied in order to maintain the weakly-ionized plasma 262. The pulsed power supply 234 can be designed so as to output a continuous nominal power in order to sustain the weakly-ionized plasma 262.

Between time $t_2$ and time $t_3$, the pulsed power supply 234 delivers a large voltage pulse 338 across the weakly-ionized plasma 262. In some embodiments, the large voltage pulse 338 has a voltage that is in the range of 200V to 30 kV. In some embodiments, the period between time $t_2$ and time $t_3$ is in the range of 0.1 microsecond to ten seconds. Between time $t_3$ and time $t_4$, the large voltage pulse 338 is applied before the current across the weakly-ionized plasma 262 begins to increase. In one embodiment, the period between time $t_3$ and time $t_4$ can be between about ten nanoseconds and one microsecond.

Between time $t_4$ and time $t_5$, the voltage 340 drops as the current 342 increases. The power 344 also increases between time $t_4$ and time $t_5$, until a quasi-stationary state exists between the voltage 346 and the current 348. The period between time $t_4$ and time $t_5$ is on order of several hundreds nanoseconds.

In one embodiment, at time $t_5$, the voltage 346 is in the range of 50V to 30 kV, the current 348 is in the range of 10 A to 5 kA and the power 350 is in the range of 1 kW to 10 MW. The power 350 is continuously applied to the plasma until time $t_6$. In one embodiment, the period between time $t_5$ and time $t_6$ is in the range of one microsecond to ten seconds.

The pulsed power supply 234 delivers a high power pulse having a maximum power 350 and a pulse width that is sufficient to transform the weakly-ionized plasma 262 to a strongly-ionized plasma 268 (see FIG. 2D). At time $t_6$, the maximum power 350 is terminated. In one embodiment, the pulsed power supply 234 continues to supply a background power that is sufficient to maintain the plasma after time $t_6$.

In one embodiment, the power supply 234 maintains the plasma after the delivery of the high-power pulse by continuing to apply a power 352 to the plasma that is in the range of 0.01 kW to 100 kW. The continuously generated power maintains the pre-ionization condition in the plasma, while the pulsed power supply 234 prepares to deliver the next high-power pulse.

At time $t_7$, the pulsed power supply 234 delivers the next high-power pulse (not shown). In one embodiment, the repetition rate between the high-power pulses is in the range of 0.1 Hz and 1 kHz. The particular size, shape, width, and frequency of the high-power pulses depend on various factors including process parameters, the design of the pulsed power supply 234, the geometry of the sputtering system 200, the volume of plasma, the density of the strongly-ionized plasma 268, and the pressure in the region 245. The shape and duration of the leading edge 356 and the trailing edge 358 of the high-power pulse 354 is chosen so as to sustain the weakly-ionized plasma 262 while controlling the rate of ionization of the strongly-ionized plasma 268.

In another embodiment (not shown), the power supply 234 generates a constant voltage. In this embodiment, the applied voltage 320 is continuously applied from time $t_2$ until time $t_6$. The current 322 and the power 324 rise until time $t_6$ where they maintain a constant voltage level, and then the voltage 320 is terminated. In one embodiment, the values for the current, power and voltage are optimized for generating exited atoms.

In one embodiment of the invention, the efficiency of the ionization process is increased by generating a magnetic field proximate to the cathode assembly 216. The magnetic field substantially traps electrons in the weakly-ionized plasma 262 proximate to the cathode assembly 216. The trapped electrons ionize the excited atoms 274 thereby generating the strongly-ionized plasma 268. In this embodiment, the magnetically enhanced plasma has strong diamagnetic properties. The term "strong diamagnetic properties" is defined herein to mean that the magnetically enhanced high-density plasma discharge tends to exclude external magnetic fields from the plasma volume.

FIG. 7A through FIG. 7D illustrate various simulated magnetic field distributions 400, 402, 404, and 406 proximate to the cathode assembly 216 for various electron ExB drift currents in a magnetically enhanced plasma sputtering apparatus according to the invention. The magnetically enhanced plasma generating apparatus includes a magnet assembly 252 that is positioned proximate to the cathode assembly 216. The magnet assembly 252 generates a magnetic field proximate to the cathode assembly 216. In one embodiment, the strength of the magnetic field is in the range of fifty to two thousand gauss. The simulated magnetic fields distributions 400, 402, 404, and 406 indicate that high-power plasmas having high current density tend to diffuse homogeneously in an area 246 of the magnetically enhanced plasma sputtering apparatus.

The high-power pulses applied between the cathode assembly 216 and the anode 238 generate secondary electrons from the cathode assembly 216 that move in a substantially circular motion proximate to the cathode assembly 216 according to crossed electric and magnetic fields. The substantially circular motion of the electrons generates an electron ExB drift current. The magnitude of the electron ExB drift current is proportional to the magnitude of the discharge current in the plasma and, in one embodiment, is approximately in the range of three to ten times the magnitude of the discharge current.

In one embodiment, the substantially circular electron ExB drift current generates a magnetic field that interacts with the magnetic field generated by the magnet assembly 252. In one embodiment, the magnetic field generated by the electron ExB drift current has a direction that is substantially opposite to the magnetic field generated by the magnet assembly 252. The magnitude of the magnetic field generated by the electron ExB drift current increases with increased electron ExB drift current. The homogeneous diffusion of the strongly-ionized plasma in the region 246 is caused, at least in part, by the interaction of the magnetic field generated by the magnet assembly 252 and the magnetic field generated by the electron ExB drift current.

In one embodiment, the electron ExB drift current defines a substantially circular shape for a low current density plasma. However, as the current density of the plasma increases, the substantially circular electron ExB drift current tends to describe a more complex shape as the interaction of the magnetic field generated by the magnet assembly 252, the electric field generated by the high-power pulse, and the magnetic field generated by the electron ExB drift current become more acute. For example, in one embodiment, the electron ExB drift current has a substantially cycloidal shape. Thus, the exact shape of the electron ExB drift current can be complex and depends on various factors.

Figure 7A:
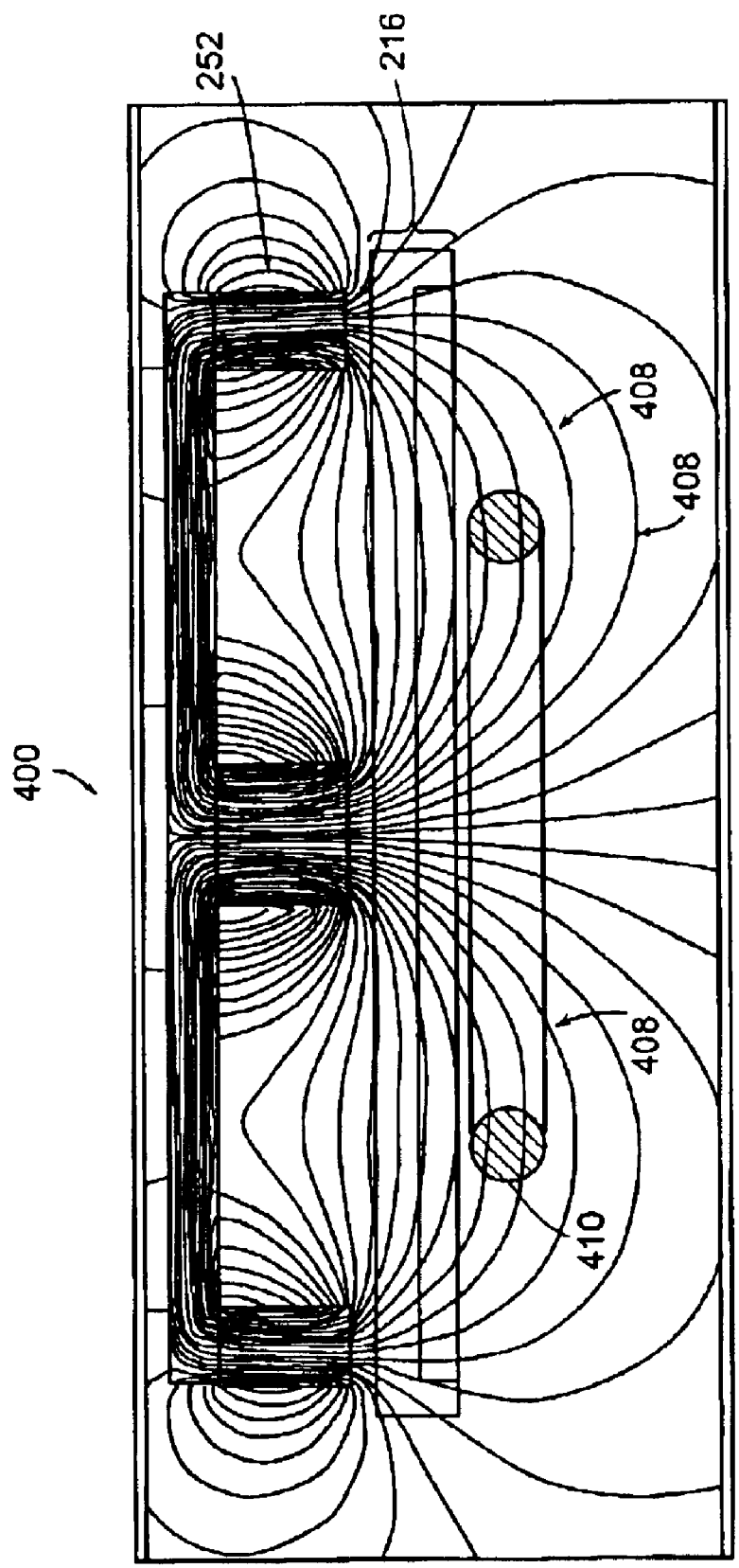
FIG. 7A through FIG. 7D illustrate various simulated magnetic field distributions proximate to the cathode assembly for various electron ExB drift currents in a magnetically enhanced plasma sputtering apparatus according to the invention.

For example, FIG. 7A illustrates the magnetic field lines 408 produced from the interaction of the magnetic field generated by the magnet assembly 252 and the magnetic field generated by an electron ExB drift current 410. The electron ExB drift current 410 is generated proximate to the cathode assembly 216 and is illustrated by a substantially circularly shaped ring. In the example shown in FIG. 7A, the electron ExB drift current 410 is approximately 10 A.

In one embodiment of the invention, the electron ExB drift current 410 is in the range of three to ten times as great as the discharge current. Thus, in the example shown in FIG. 7A, the discharge current is in the range of 10 A to 30 A. The magnetic field lines 408 shown in FIG. 7A indicate that the magnetic field generated by the magnet assembly 252 is substantially undisturbed by the relatively small magnetic field that is generated by the relatively small electron ExB drift current 410.

Figure 7B:
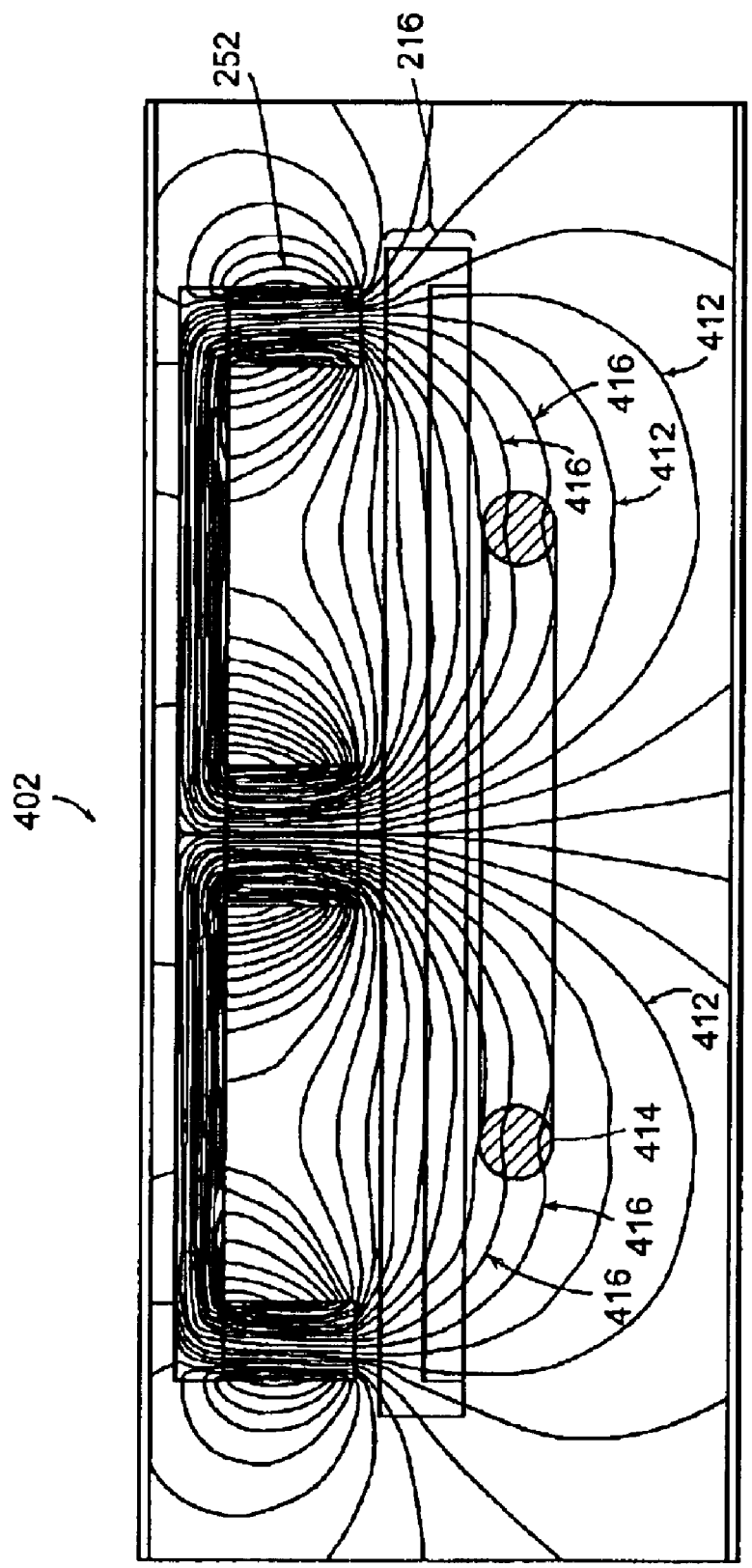

FIG. 7B illustrates the magnetic field lines 412 produced from the interaction of the magnetic field generated by the magnet assembly 252 and the magnetic field generated by an electron ExB drift current 414. The electron ExB drift current 414 is generated proximate to the cathode assembly 216. In the example shown in FIG. 7B, the electron ExB drift current 414 is approximately 300 A. Since the electron ExB drift current 414 is typically between about three and ten times as great as the discharge current, the discharge current in this example is in the range of 30 A and 100 A.

The magnetic field lines 412 that are generated by the magnet assembly 252 are substantially undisturbed by the relatively small magnetic field generated by the relatively small electron ExB drift current 414. However, the magnetic field lines 416 that are closest to the electron ExB drift current 414 are somewhat distorted by the magnetic field generated by the electron ExB drift current 414. The distortion suggests that a larger electron ExB drift current should generate a stronger magnetic field that will interact more strongly with the magnetic field generated by the magnet assembly 252.

Figure 7C:
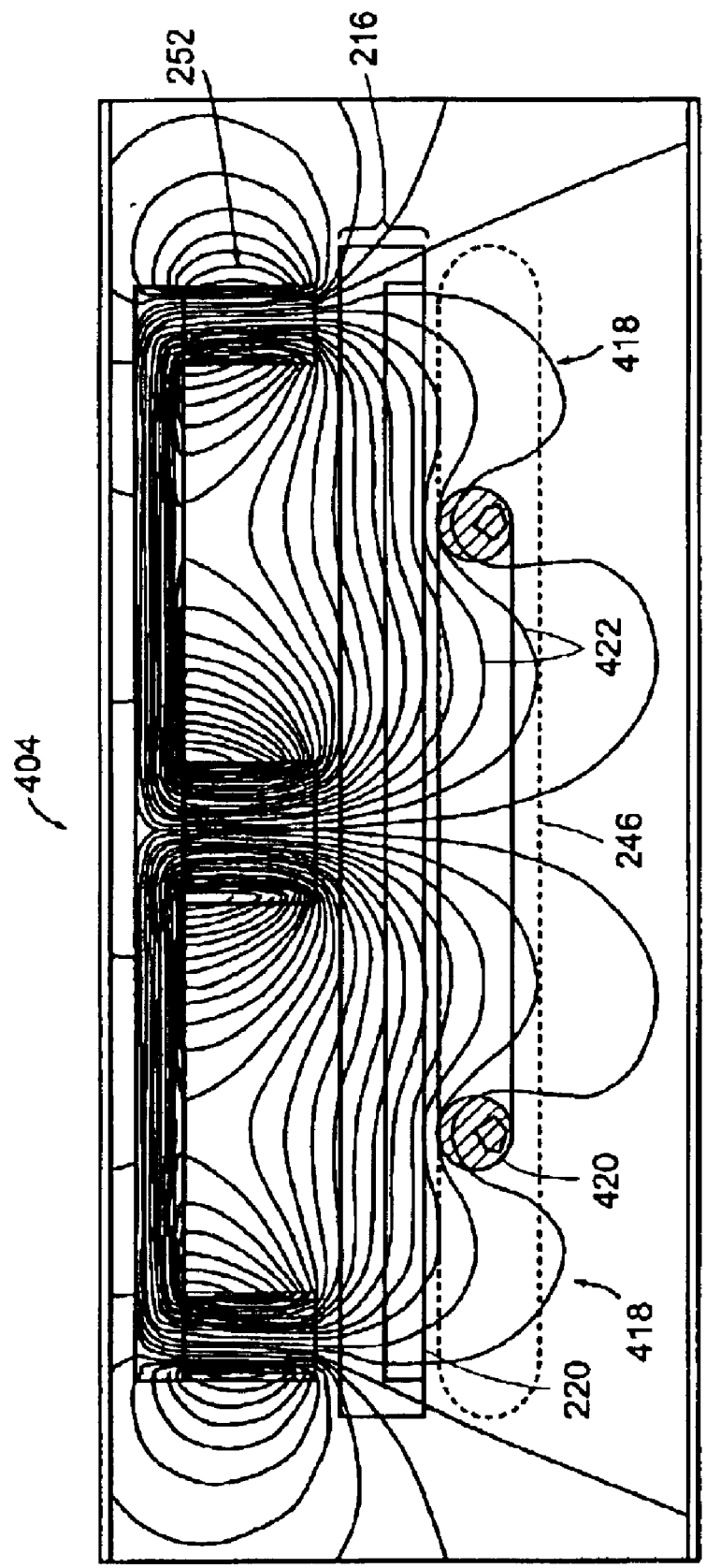

FIG. 7C illustrates the magnetic field lines 418 that are produced from the interaction of the magnetic field generated by the magnet assembly 252 and the magnetic field generated by an electron ExB drift current 420. The electron ExB drift current 420 is generated proximate to the cathode assembly 216. In the example shown in FIG. 7C, the electron ExB drift current 420 is approximately 1,000 A. Since the electron ExB drift current 420 is typically between about three and ten times as great as the discharge current, the discharge current in this example is approximately between 100 A and 300 A.

The magnetic field lines 418 that are generated by the magnet assembly 252 exhibit substantial distortion that is caused by the relatively strong magnetic field generated by the relatively large electron ExB drift current 420. Thus, the larger electron ExB drift current 420 generates a stronger magnetic field that strongly interacts with and can begin to dominate the magnetic field generated by the magnet assembly 252.

The interaction of the magnetic field generated by the magnet assembly 252 and the magnetic field generated by the electron ExB drift current 420 substantially generates magnetic field lines 422 that are somewhat more parallel to the surface of the cathode assembly 216 than the magnetic field lines 408, 412, and 416 in FIG. 7A and FIG. 7B. The magnetic field lines 422 allow the strongly-ionized plasma 268 to more uniformly distribute itself in the area 246. Thus, the strongly-ionized plasma 268 is uniformly diffused in the area 246.

Figure 7D:
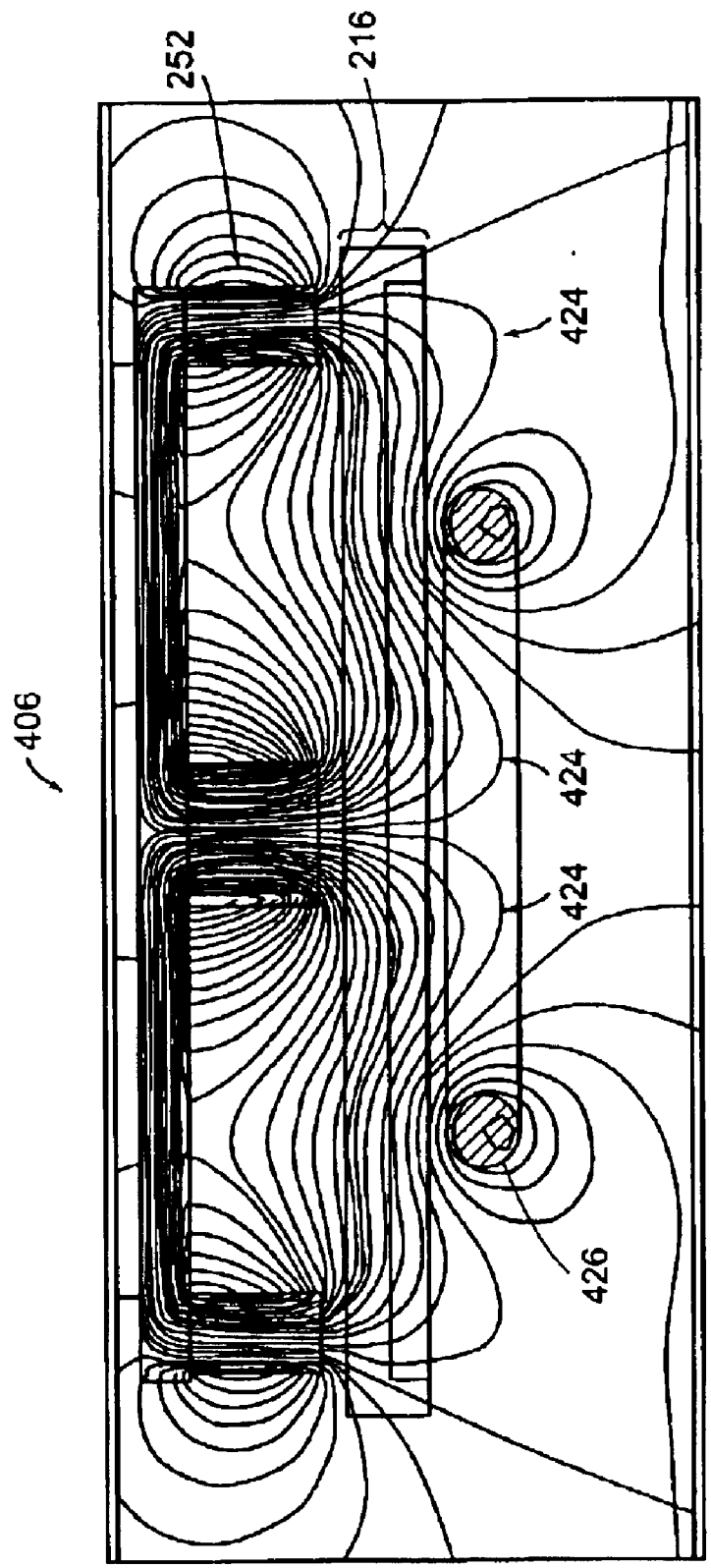

FIG. 7D illustrates the magnetic field lines 424 produced from the interaction of the magnetic field generated by the magnet assembly 252 and the magnetic field generated by an electron ExB drift current 426. The electron ExB drift current 426 is generated proximate to the cathode assembly 216. In the example shown in FIG. 7D, the electron ExB drift current 426 is approximately 5 kA. The discharge current in this example is approximately between 500 A and 1,700 A.

The magnetic field lines 424 generated by the magnet assembly 252 exhibit relatively high distortion due to their interaction with the relatively strong magnetic field generated by the relatively large electron ExB drift current 426. Thus, in this embodiment, the relatively large electron ExB drift current 426 generates a very strong magnetic field that is substantially stronger than the magnetic field generated by the magnet assembly 252.

A large electron ExB drift current can enhance the rate of ionization of the strongly-ionized plasma by trapping secondary electrons from the cathode assembly 216. The secondary electrons ionize neutral and excited atoms and molecules. A strongly-ionized plasma having a high density of ions can increase the deposition rate in a plasma sputtering process according to the invention.

The deposition rate of a sputtering process can be expressed as follows:

$$R_D = K \times Y \times I$$

where K is a geometrical factor, Y is the sputtering yield, and I is the discharge current. Thus, the deposition rate is proportional to the sputtering yield Y. The sputtering yield Y is defined as the number of atoms sputtered per incident ion and depends on the type of ions that bombard the target surface, the energy of the ions, the incident angle of the bombarding ions, the binding energy of the target material, and the target temperature. In a typical sputtering process involving a so-called "cold cathode," the temperature of the target is gradually heated and that heat is dissipated using liquid cooling as described with reference to FIG. 2. This typical sputtering process uses momentum and energy exchange of bombarding ions to dislodge target atoms.

To substantially increase the deposition rate, the present invention generates a very high discharge current and a very high sputtering yield. The high-power pulse is applied almost instantaneously, causing an explosive reaction at the surface of the target. The explosive reaction rapidly vaporizes a surface layer of the target.

Figure 8:
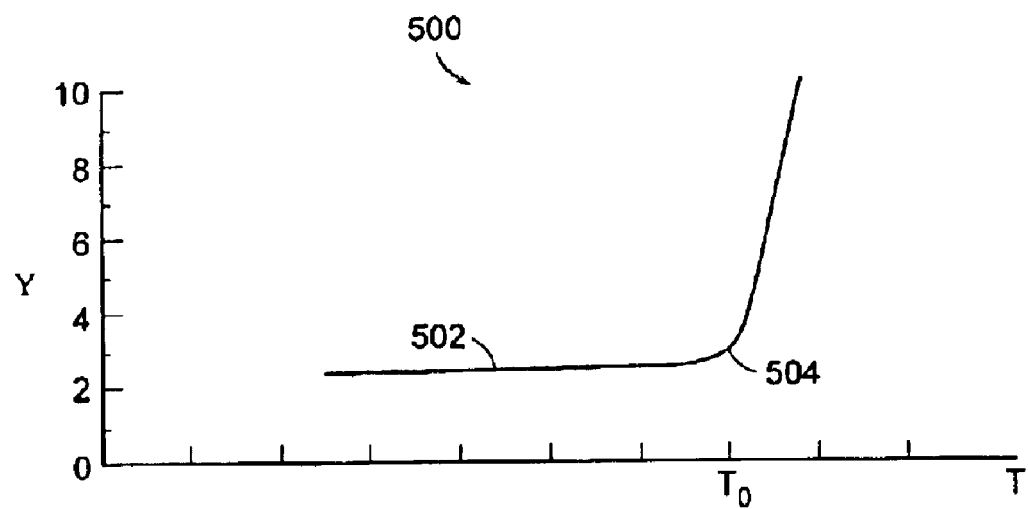
FIG. 8 illustrates a graphical representation of sputtering yield as a function of temperature of the sputtering target.

FIG. 8 illustrates a graphical representation 500 of sputtering yield Y as a function of temperature T of the sputtering target 220 of FIG. 4. A higher deposition rate can be achieved according to the present invention by using a thermal sputtering process. In one embodiment, the deposition rate is increased by increasing the sputtering yield. The sputtering yield of the target 220 is increased as the temperature of the target 220 is increased. As the temperature of the target 220 is increased, the sputtering yield slowly increases in a substantially linear manner as shown in region 502. In the region 502, the sputtering yield generally does not depend on the temperature of the target 220.

When the temperature of the target reaches temperature $T_0$ 504, the sputtering yield increases at a non-linear rate. In one embodiment, the sputtering yield increases at an exponential rate. The temperature $T_0$ is approximately equal to 0.7 $T_m$, where $T_m$ is the melting point of the target material. In another embodiment, the temperature $T_0$ is approximately equal to U/40 k, where U is the binding energy for a surface atom and k is Boltzman's constant.

The sputtering yield at or above the target temperature $T_0$ can be expressed as follows:

$$Y_T = c \frac{\tau}{\sqrt{T_0 + \Delta T_M}} \exp\left(-\frac{U}{T_0 + \Delta T_M}\right),$$

$$\tau = \frac{R^2}{\kappa}\left(\frac{T_0 + \Delta T_M}{U}\right)^2$$

where $\Delta T_M$ is the maximum difference of the target temperature from the temperature $T_0$, R is the initial radius of the high temperature area on the target, $\tau$ is the time period for the high temperature in the high temperature area, $\kappa$ is the coefficient for the temperature conductivity, and U is the binding energy.

When high power pulses having the appropriate power level and duration are applied to the plasma according to the present invention, the sputtering yield increases non-linearly. In one embodiment, the sputtering yield increases substantially in an exponential manner. According to one embodiment of the invention, a high power pulse is applied to a weakly-ionized plasma 262 (FIG. 5C) for a relatively short duration. This high power pulse creates a strongly-ionized plasma 268 (FIG. 5D) that contains a high density of energetic ions 272.

Thus, in one embodiment, a very large quantity of explosive energy at the target surface results in a sputtering yield that increases exponentially. The explosive energy causes the temperature at the target surface to increase rapidly. This rapid increase in temperature results in a surface layer of the target being substantially evaporated and sputtered at a very high rate compared with known sputtering techniques. In one embodiment, the deposition rate of a target material is greater than one micron per minute.

Figure 9:
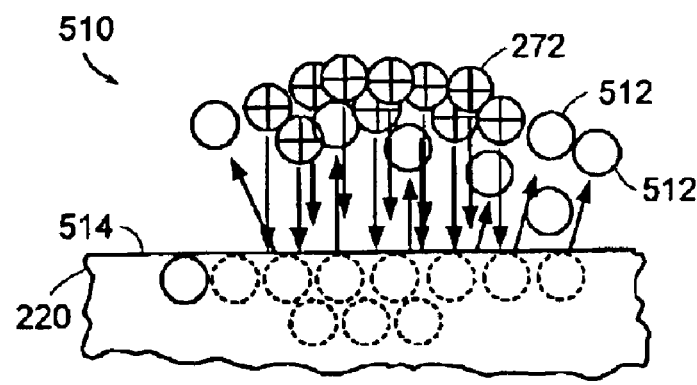
FIG. 9 illustrates a process for sputtering material from a target according one embodiment of the present invention.

FIG. 9 illustrates a process 510 for sputtering atoms 512 from a target 220 according one embodiment of the invention. In one embodiment, the target 220 is negatively biased. The negative bias causes the energetic ions 272 in the strongly-ionized plasma 268 to vigorously impact the surface 514 of the target 220, thereby causing the temperature of the target to rapidly increase. When the temperature of the target reaches the temperature $T_0$, the sputtering yield increases nonlinearly. In one embodiment, the sputtering yield increases almost exponentially. Consequently, the deposition rate rapidly increases. The sputtering yield can depend on the properties of the target material, such as the crystal structure, the binding energy of the surface atoms, and/or the melting point of the target material.

Figure 10:
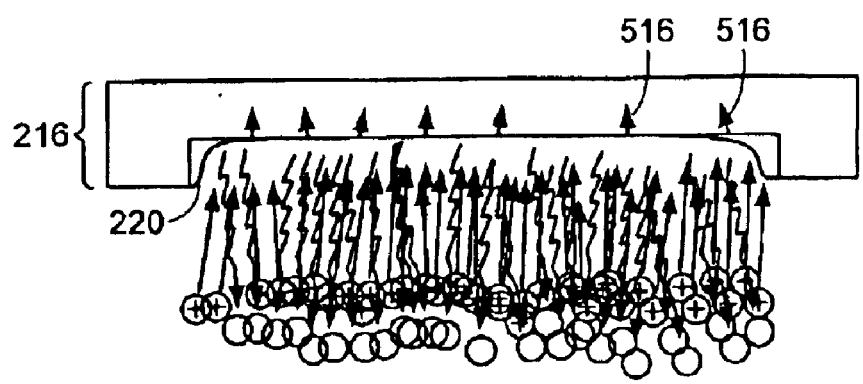
FIG. 10 illustrates a cross-sectional view of a cathode assembly according to one embodiment of the invention.

FIG. 10 illustrates a cross-sectional view of a cathode assembly 216 according to one embodiment of the invention. When the temperature of the target 220 reaches a certain level, the target material is evaporated in an avalanche-like manner. In one embodiment, the high-power pulse generates thermal energy 516 into only a shallow depth of the target 220 so as to not substantially increase an average temperature of the target 220. The target material is almost instantly evaporated. However damage to the target 220 itself is minimal because thermal energy only penetrates into the shallow skin depth.

Figure 11B:
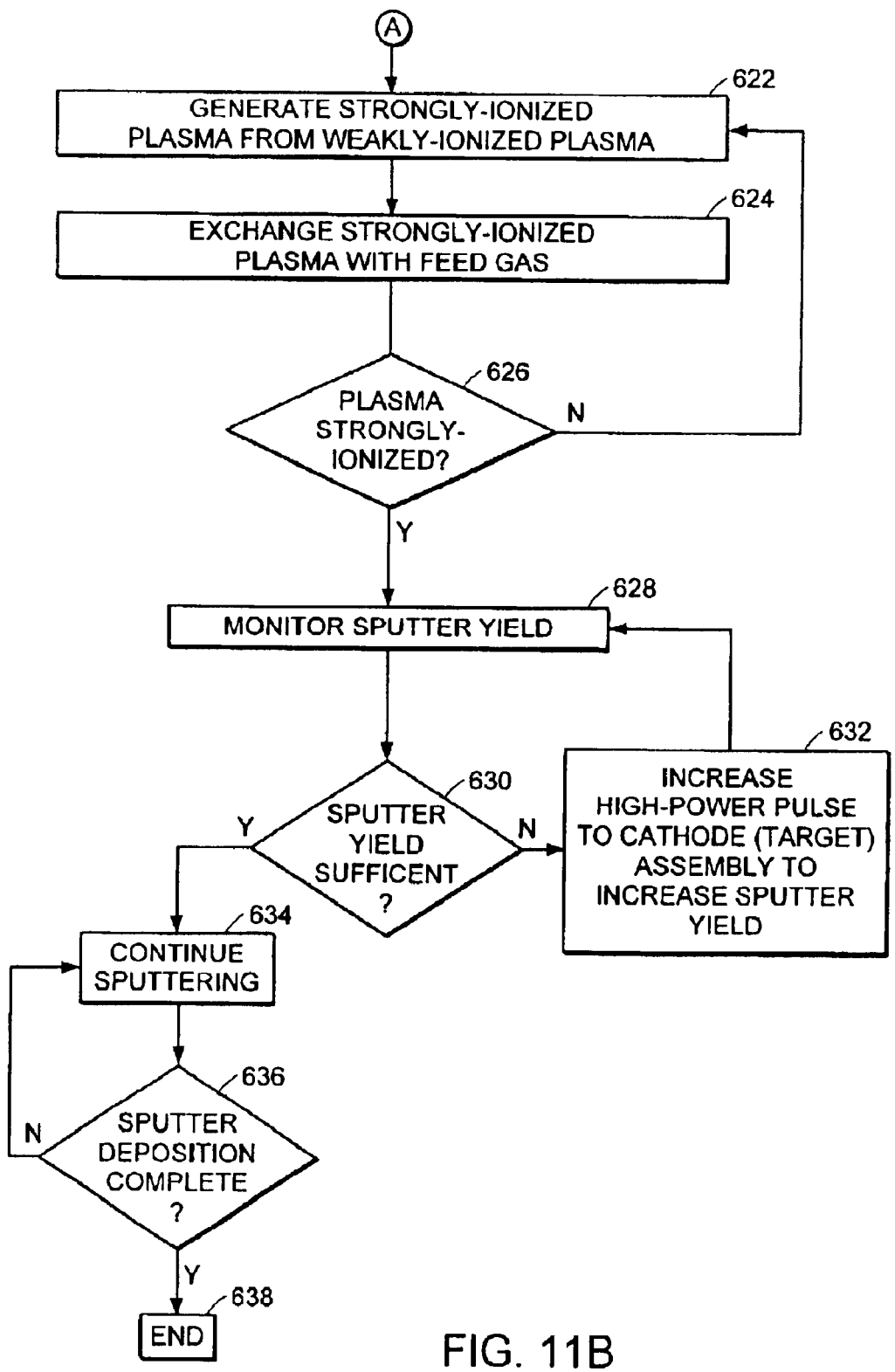
FIG. 11 is a flowchart of an illustrative process of enhancing a sputtering yield of a sputtering target according to the present invention.

FIG. 11 is a flowchart 600 of an illustrative process of enhancing a sputtering yield of a sputtering target according to the present invention. The process is initiated (step 602) by pumping the chamber 202 down to a specific pressure (step 604). Next, the pressure in the chamber is evaluated (step 606). In one embodiment, a feed gas is then pumped into the chamber (step 608). The gas pressure is evaluated (step 610). If the gas pressure is correct, the pressure in the chamber is again evaluated (step 612).

If the pressure in the chamber is correct, an appropriate magnetic field 254 (FIG. 4) can be generated proximate to the feed gas 256 (FIG. 5B) (step 614). In one embodiment, a magnet assembly 252 can include at least one permanent magnet, and thus the magnetic field is generated constantly, even before the process is initiated. In another embodiment, a magnetic assembly 252 includes at least one electromagnet, and thus the magnetic field is generated only when the electromagnet is operating. In one embodiment, the magnetic field 254 is then evaluated (step 616).

The feed gas 256 is ionized to generate a weakly-ionized plasma 262 (step 618). In one embodiment, the weakly-ionized plasma 262 is generated by creating a relatively low current discharge in the gap 244 between the cathode assembly 216 and the anode 238. In another embodiment (not shown), the weakly-ionized plasma 262 can be generated by creating a relatively low current discharge between an ionizing electrode and the cathode assembly 216. In yet another embodiment (not shown), an electrode is heated to emit electrons proximate to the cathode assembly 216. In this embodiment, a relatively low current discharge is created between the anode 238 and the electrode in order to generate the weakly-ionized plasma 262. In the embodiment shown in FIG. 4, for example, the weakly-ionized plasma 262 is generated by applying a potential across the gap 244 between the cathode assembly 216 and the anode 238 after the introduction of the feed gas 256.

When the gas is weakly-ionized (step 620), A strongly-ionized plasma 268 (FIG. 5D) is generated from the weakly-ionized plasma 262 (step 622). In one embodiment, the strongly-ionized plasma 268 is generated by applying a high-power pulse between the cathode assembly 216 and the anode 238. As described herein, the high-power pulse causes a strong electric field 266 to be generated in the gap 244 between the anode 238 and the cathode assembly 216.

The strong electric field 266 causes the feed gas to experience stepwise ionization. In one embodiment, the feed gas includes a molecular gases and the strong electric field 266 increases the formation of ions that enhance the strongly-ionized plasma 268. In one embodiment, the strongly-ionized plasma 268 is substantially homogeneous in the area 264 of FIG. 5D. This homogeneity results in more uniform erosion of the sputtering target 220 and, therefore, relatively high target utilization. Since the cathode assembly 216 is negatively biased relative to the anode 238, the cathode assembly 216 attracts ions from the strongly-ionized substantially uniform plasma. This causes the ions to bombard the cathode assembly 216, thereby resulting in sputtering of the target material.

In one embodiment, the strongly-ionized plasma is enhanced through the rapid exchange of the strongly-ionized plasma with a fresh volume of feed gas 256 (step 624). This rapid exchange occurs in the region 245. In one embodiment, the rapid exchange of the strongly-ionized plasma occurs during the duration of the high-power pulse.

After the strongly-ionized plasma 268 is formed (step 626), the sputtering yield is monitored (step 628) by known monitoring techniques. If the sputtering yield is insufficient (step 630), the power delivered to the plasma is increased (step 632). In one embodiment, increasing the magnitude of the high-power pulse applied between the cathode assembly 216 and the anode 238 increases the power delivered to the plasma. In one embodiment, the power delivered to the plasma is sufficient to vaporize a surface layer of the target. This increases the sputtering yield in a substantially nonlinear fashion.

The sputter yield is again evaluated (step 628). This process continues until the sputter yield is sufficient (step 630), and sputtering continues (step 634). Once the sputter deposition is completed (step 636), the sputter process is terminated (step 638).

Equivalents

While the invention has been particularly shown and described with reference to specific embodiments, it should be understood by those skilled in the art that various changes in form and detail may be made therein without departing from the spirit and scope of the invention as defined herein.

What is claimed is:

1. A sputtering source comprising:
   a cathode assembly that is positioned adjacent to an anode, the cathode assembly including a sputtering target;
   an ionization source that generates a weakly-ionized plasma from a feed gas proximate to the anode and the cathode assembly; and
   a power supply that generates a voltage pulse between the anode and the cathode assembly that creates a strongly-ionized plasma from the weakly-ionized plasma, an amplitude and a rise time of the voltage pulse being chosen to increase a density of ions in the strongly-ionized plasma enough to generate sufficient thermal energy in the sputtering target to cause a sputtering yield to be non-linearly related to a temperature of the sputtering target.

2. The sputtering source of claim 1 wherein an electric field between the anode and the cathode assembly comprises a quasi-static electric field.

3. The sputtering source of claim 1 further comprising a gas flow controller that controls a flow of the feed gas so that the feed gas diffuses the strongly-ionized plasma.

4. The sputtering source of claim 3 wherein the feed gas allows additional power to be absorbed by the strongly ionized plasma, thereby generating additional thermal energy in the sputtering target.

5. The sputtering source of claim 1 wherein the thermal energy generated in the sputtering target does not substantially increase an average temperature of the sputtering target.

6. The sputtering source of claim 1 further comprising a magnet that is positioned to generate a magnetic field proximate to the weakly-ionized plasma, the magnetic field substantially trapping electrons in the weakly-ionized plasma proximate to the sputtering target.

7. The sputtering source of claim 1 wherein the voltage pulse generated between the anode and the cathode assembly excites atoms in the weakly-ionized plasma and generates secondary electrons from the cathode assembly, the secondary electrons ionizing the excited atoms, thereby creating the strongly-ionized plasma.

8. The sputtering source of claim 1 wherein the power supply generates a constant power.

9. The sputtering source of claim 1 wherein the power supply generates a constant voltage.

10. The sputtering source of claim 1 wherein the ionization source is chosen from the group comprising an electrode coupled to a DC power supply, an electrode coupled to an AC power supply, a UV source, an X-ray source, an electron beam source, an ion beam source, an inductively coupled plasma source, a capacitively coupled plasma source, and a microwave plasma source.

11. The sputtering source of claim 1 wherein a rise time of the voltage pulse is chosen to increase an ionization rate of the strongly-ionized plasma.

12. The sputtering source of claim 1 wherein the weakly-ionized plasma reduces the probability of developing an electrical breakdown condition between the anode and the cathode assembly.

13. The sputtering source of claim 1 wherein the strongly-ionized plasma is substantially uniform proximate to the cathode assembly.

14. The sputtering source of claim 1 wherein a distance between the anode and the cathode assembly is chosen to increase an ionization rate of strongly-ionized plasma.

15. The sputtering source of claim 1 wherein the rise time of the voltage pulse is in the range of approximately 0.1 microsecond to 10 seconds.

16. The sputtering source of claim 1 wherein the amplitude of the voltage pulse is in the range of approximately 200V to 30 kV.

17. The sputtering source of claim 1 wherein a pulse width of the voltage pulse is in the range of approximately 10 microsecond to 10 seconds.

18. The sputtering source of claim 1 wherein the ionization source and the power supply comprise a single power supply.

19. The sputtering source of claim 1 wherein a repetition rate between the voltage pulses is in the range of 0.1 Hz to 1 kHz.

20. The sputtering source of claim 6 wherein the magnet is chosen from the group comprising a permanent magnet, an electro-magnet, a balanced magnet configuration, and an unbalanced magnet configuration.

21. A method for high deposition rate sputtering, the method comprising:
   ionizing a feed gas to generate a weakly-ionized plasma proximate to a cathode assembly that comprises a sputtering target; and
   applying a voltage pulse to the cathode assembly to generate a strongly-ionized plasma from the weakly-ionized plasma, an amplitude and a rise time of the voltage pulse being chosen so that ions in the strongly-ionized plasma generate sufficient thermal energy in the sputtering target to cause a sputtering yield to be non-linearly related to a temperature of the sputtering target, thereby increasing a deposition rate of the sputtering.

22. The method of claim 21 further comprising generating a magnetic field proximate to the sputtering target, the magnetic field trapping electrons proximate to the sputtering target.

23. The method of claim 21 wherein the voltage pulse applied to the cathode assembly generates excited atoms in the weakly-ionized plasma and generates secondary electrons from the sputtering target, the secondary electrons ionizing the excited atoms, thereby creating the strongly-ionized plasma.

24. The method of claim 21 further comprising diffusing the weakly-ionized plasma with a volume of the feed gas while ionizing the volume of the feed gas to create additional weakly-ionized plasma.

25. The method of claim 21 further comprising diffusing the strongly-ionized plasma with a volume of the feed gas while applying the voltage pulse to the cathode assembly to generate additional strongly-ionized plasma from the volume of the feed gas.

26. The method of claim 21 wherein the peak plasma density of the weakly-ionized plasma is less than about $10^{12}$ $cm^{-3}$.

27. The method of claim 21 wherein the weakly-ionized plasma reduces the probability of developing an electrical breakdown condition.

28. The method of claim 21 wherein the ionizing the feed gas comprises exposing the feed gas to one of a static electric field, an AC electric field, a quasi-static electric field, a pulsed electric field, UV radiation, X-ray radiation, an electron beam, and an ion beam.

29. The method of claim 21 wherein the ions in the strongly-ionized plasma causes at least a portion of a surface layer of the sputtering target to evaporate.

30. The method of claim 21 wherein the peak plasma density of the strongly-ionized plasma is greater than about $10^{12}$ $cm^{-3}$.

31. The method of claim 21 wherein the rise time of the voltage pulse is in the range of approximately 0.1 microsecond and 10 seconds.

32. The method of claim 21 wherein the amplitude of the voltage pulse is in the range of approximately 200V to 30 kV.

33. The method of claim 21 wherein a pulse width of the voltage pulse is in the range of approximately 1 microsecond to 10 seconds.

34. A sputtering source comprising:
- a cathode assembly that is positioned adjacent to an anode, the cathode assembly including a sputtering target;
- an ionization source that generates a weakly-ionized plasma from a feed gas proximate to the anode and the cathode assembly;
- a power supply that generates a voltage pulse between the anode and the cathode assembly that creates a strongly-ionized plasma from the weakly-ionized plasma, an amplitude and a rise time of the voltage pulse being chosen to increase a density of ions in the strongly-ionized plasma enough to generate sufficient thermal energy in the sputtering target to cause a sputtering yield to be non-linearly related to a temperature of the sputtering target; and
- a gas controller that controls a flow of the feed gas to the strongly-ionized plasma to facilitate the creation of additional ions that generate additional thermal energy in the sputtering target.

35. The sputtering source of claim 34 wherein the gas controller controls a flow of feed gas that diffuses strongly-ionized plasma.

36. The sputtering source of claim 34 wherein the thermal energy does not substantially increase an average temperature of the entire sputtering target.

37. The sputtering source of claim 34 wherein the rise time of the voltage pulse is in the range of approximately 0.1 microsecond to 10 seconds.

38. The sputtering source of claim 34 wherein the amplitude of the voltage pulse is in the range of approximately 200V to 30 kV.

39. The sputtering source of claim 34 wherein a pulse width of the voltage pulse is in the range of approximately 1 microsecond to 10 seconds.

40. A sputtering source comprising:
- means for ionizing a feed gas to generate a weakly-ionized plasma; and
- means for increasing the density of the weakly-ionized plasma to generate a strongly-ionized plasma having a density of ions that generate sufficient thermal energy in the sputtering target to cause a sputtering yield to be non-linearly related to a temperature of the sputtering target.

* * * * *

UNITED STATES PATENT AND TRADEMARK OFFICE
CERTIFICATE OF CORRECTION

PATENT NO. : 6,896,773 B2  Page 1 of 1
APPLICATION NO. : 10/065739
DATED : May 24, 2005
INVENTOR(S) : Chistyakov It is certified that error appears in the above-identified patent and that said Letters Patent is hereby corrected as shown below:

Col. 22, line 63:
Replace "causes" with --cause--

Signed and Sealed this

Twentieth Day of November, 2007

JON W. DUDAS
*Director of the United States Patent and Trademark Office*